(12) United States Patent
Yamazaki

(10) Patent No.: US 8,772,714 B2
(45) Date of Patent: Jul. 8, 2014

(54) TRANSMISSION ELECTRON MICROSCOPE AND METHOD OF OBSERVING TEM IMAGES

(71) Applicant: JEOL Ltd., Tokyo (JP)

(72) Inventor: Kazuya Yamazaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 13/667,046

(22) Filed: Nov. 2, 2012

(65) Prior Publication Data

US 2013/0299696 A1    Nov. 14, 2013

(30) Foreign Application Priority Data

Nov. 2, 2011  (JP) ................................. 2011-241274

(51) Int. Cl.
*H01J 37/26* (2006.01)
(52) U.S. Cl.
CPC ..................................... *H01J 37/26* (2013.01)
USPC ....................................................... 250/311
(58) Field of Classification Search
USPC ....................................................... 250/311
See application file for complete search history.

(56) References Cited

U.S. PATENT DOCUMENTS

| | | | | |
|---|---|---|---|---|
| 4,812,652 A | * | 3/1989 | Egle et al. | 250/311 |
| 5,866,905 A | * | 2/1999 | Kakibayashi et al. | 250/311 |
| 6,750,451 B2 | * | 6/2004 | Koguchi et al. | 250/311 |
| 6,841,775 B2 | * | 1/2005 | Kondo et al. | 850/9 |
| 8,389,937 B2 | * | 3/2013 | Own et al. | 250/311 |

FOREIGN PATENT DOCUMENTS

JP          4334858 A       11/1992

\* cited by examiner

*Primary Examiner* — Kiet T Nguyen
(74) *Attorney, Agent, or Firm* — The Webb Law Firm

(57) ABSTRACT

A transmission electron microscope (TEM) includes an electron beam source (2), an illumination lens (4), a first objective lens (6), a second objective lens (8), a selected area aperture (16), a projector lens (10), a detector (12), and a control portion (22). A first plane (17) is located between the second objective lens (8) and the projector lens (10). The control portion (22) performs first sets of processing for controlling the illumination lens (4) such that an electron beam (L) hits the sample (S), controlling the second objective lens (8) such that a diffraction pattern of the sample (S) is imaged onto the first plane (17), and controlling the projector lens (10) such that a TEM image of the sample (S) formed by the second objective lens (8) is focused onto a second plane where the light-sensitive portion (13) of the detector (12) is disposed.

4 Claims, 26 Drawing Sheets

TRANSMISSION ELECTRON MICROSCOPE AND METHOD OF OBSERVING TEM IMAGES

BACKGROUND OF THE INVENTION

1. Field of the Invention

The present invention relates to a transmission electron microscope (TEM) and to a method of observing TEM images.

2. Description of Related Art

A transmission electron microscope (TEM) is configured including an electron beam source, an illumination lens, a first objective lens, an objective aperture, a second objective lens (objective minilens), a selected area aperture, and a projector lens, as disclosed, for example, in JP-A-4-334858. The TEM permits observation of TEM images such as diffraction patterns and real space images of samples.

In such transmission electron microscopy, selected-area electron beam diffraction is known as one method of observing diffraction patterns of samples.

FIG. 26 is a cross section illustrating one example of operation of a conventional transmission electron microscope, generally indicated by reference numeral 1000, when a diffraction pattern of a sample is observed using selected-area electron beam diffraction.

As shown in FIG. 26, the transmission electron microscope 1000 has an electron beam source 1002 emitting an electron beam L which is directed at a sample S by the use of an illumination lens 1004, condenser aperture 1014, objective lens 1006, second objective lens 1008, projector lens 1010, and detector 1012. The resulting diffraction pattern of the electron beam is imaged using an objective lens 1006 and a projector lens 1010. A diffraction pattern of a selected area on the sample S can be observed by selecting the area using a selected area aperture 1016. A real space image of this area can be obtained from the condition where the diffraction pattern is obtained, by varying the operative conditions of the projector lens 1010 while holding the operative conditions of the objective lens 1006. Data indicating the relationship between the diffraction pattern and the real space image can be derived through the use of selected-area electron beam diffraction in this way.

However, in the aforementioned observation method, a strong magnetic field is applied to the sample because an objective lens is used. Consequently, where the sample is made of a magnetic material susceptible to the effects of a magnetic field, the internal state of the sample itself may be varied by the applied field. Therefore, there is the problem that in a case where the sample is susceptible to the effects of a magnetic field, the intrinsic state of the sample cannot be observed due to the effects of the magnetic field on the sample during observation.

SUMMARY OF THE INVENTION

In view of the foregoing problem, the present invention has been made. According to some aspects of the invention, it is possible to offer a transmission electron microscope and TEM image observation method capable of reducing the effects of a magnetic field on the sample during observation of TEM images.

(1) A transmission electron microscope associated with the present invention has: an electron beam source emitting an electron beam; an illumination lens for directing the electron beam emitted from the electron beam source at a sample; a first objective lens for applying a magnetic field to the sample to thereby apply a lens action on the sample such that the electron beam transmitted through the sample forms a TEM image of the sample; a second objective lens for forming a TEM image of the sample from the electron beam transmitted through the sample; a selected area aperture disposed at a first plane and limiting passage of the electron beam transmitted through the sample; a projector lens for bringing the TEM image of the sample formed by the first objective lens or the second objective lens into focus at a second plane; a detector having a light-sensitive portion disposed at the second plane and detecting the TEM image of the sample; and a control portion for controlling at least the illumination lens, the second objective lens, and the projector lens. The first plane is located between the second objective lens and the projector lens. The control portion performs first sets of processing for controlling the illumination lens such that the electron beam hits the sample, controlling the second objective lens such that a diffraction pattern of the sample is imaged onto the first plane, and controlling the projector lens such that the TEM image of the sample formed by the second object lens is focused onto the second plane.

In this transmission electron microscope, the control portion performs the first sets of processing. As a result, the TEM image of the sample can be focused by the second objective lens and the projector lens. Consequently, during observation of the TEM image, the effects of the magnetic field on the sample can be reduced.

(2) In the transmission electron microscope associated with the present invention, the control portion can operate in a first mode where the first sets of processing are performed and in a second mode where second sets of processing are performed. The control portion also controls the first objective lens. The second sets of processing may include a processing operation for controlling the illumination lens such that the electron beam hits the sample, a processing operation for controlling the first objective lens such that the TEM image of the sample is focused, and a processing operation for controlling the projector lens such that the TEM image of the sample formed by the first objective lens is focused onto the second plane.

In this transmission electron microscope, the control portion can operate in the first mode, for example, when a sample susceptible to the effects of a magnetic field is observed. When a sample unsusceptible to the effects of a magnetic field is observed, the control portion can operate in the second mode. Accordingly, in the operation of this transmission electron microscope, the mode of operation is switched between the first and second modes according to the state of the sample to be observed, e.g., whether the sample is susceptible to the effects of a magnetic field.

(3) In the transmission electron microscope associated with the present invention, during execution of the first sets of processing, the control portion may perform an operation for controlling the projector lens such that the TEM image of the sample focused onto the second plane is adjusted in sense.

In this transmission electron microscope, the sample and the TEM image can be made coincident in sense.

(4) The transmission electron microscope associated with the present invention may further include: a scan signal generation portion for generating a scan signal; scan coils for scanning the electron beam coming from the illumination lens over the sample in response to the scan signal; and a scanned image generation portion for imaging a detection signal delivered from the detector in synchronism with the scan signal.

This transmission electron microscope can generate a scanned image.

(5) A method of observing a TEM image in accordance with the present invention starts with illuminating a sample with an electron beam, which has been emitted from an electron beam source, via an illumination lens. Then, a diffraction pattern of the sample is obtained from the electron beam transmitted through the sample. The diffraction pattern is imaged via a second objective lens onto a plane where a selected area aperture is disposed, thus forming a TEM image of the sample. This TEM image of the sample is focused onto a light-sensitive portion of a detector via a projector lens.

In this method of observing a TEM image, during observation of the TEM image, the effects of the magnetic field on the sample can be reduced.

(6) In this method of observing a TEM image, during the step of focusing the TEM image of the sample via the projector lens, the TEM image of the sample focused onto the second plane may be adjusted in sense using the projector lens.

In this method of observing a TEM image, the sample and the TEM image can be made coincident in sense.

DESCRIPTION OF THE PREFERRED EMBODIMENTS

Figure 1:
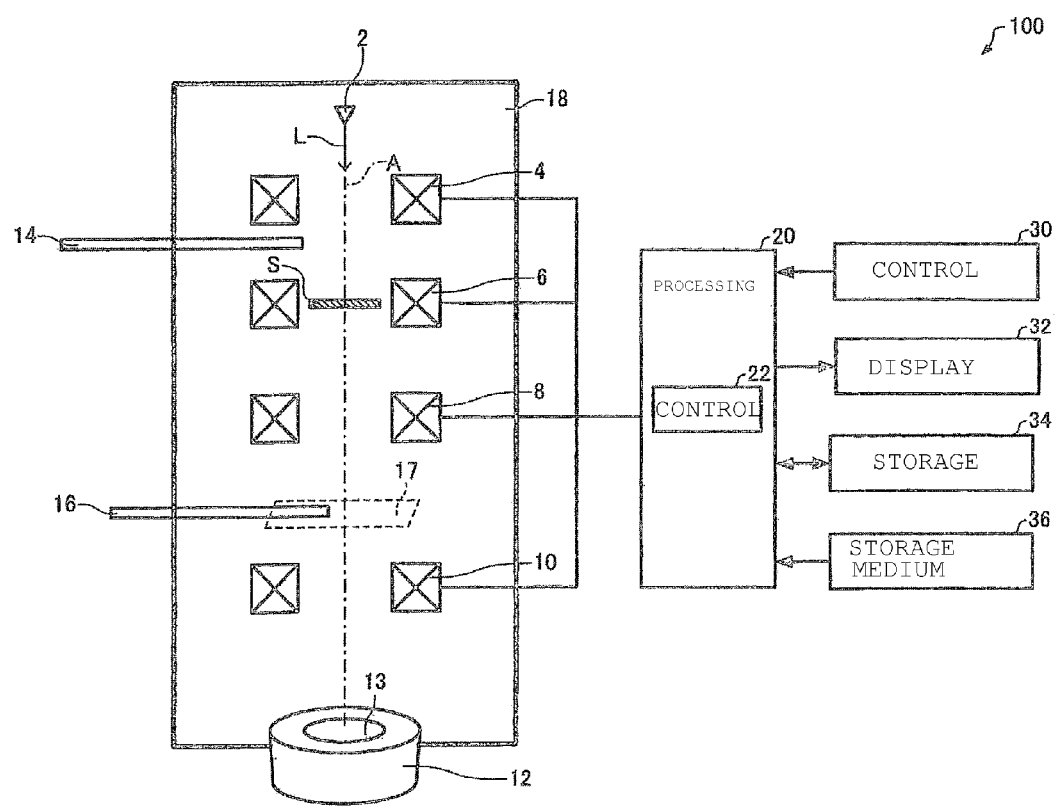
FIG. 1 is a vertical cross section, partly in block form, of a transmission electron microscope associated with a first embodiment of the present invention, showing the configuration of the microscope.

The preferred embodiments of the present invention are hereinafter described in detail with reference to the drawings. It is to be noted that the embodiments provided below do not unduly restrict the scope of the invention delineated by the appended claims and that not all the configures set forth below are constituent components of the invention.

1. First Embodiment 1.1. Configuration of Transmission Electron Microscope

The configuration of a transmission electron microscope associated with a first embodiment of the present invention is first described. The microscope is generally indicated by reference numeral 100 in FIG. 1, depicting its configuration.

As shown in FIG. 1, the transmission electron microscope 100 includes an electron beam source 2, an illumination lens 4, a first objective lens 6, a second objective lens 8, a projector lens 10, a detector 12, a selected area aperture 16, and a processing portion 20. The microscope 100 further includes a condenser aperture 14, an electron optical column 18, a manual control portion 30, a display portion 32, a storage portion 34, and an information storage medium 36.

In the transmission electron microscope 100, the above-described electron beam source 2, illumination lens 4, condenser aperture 14, first objective lens 6, second objective lens 8, selected area aperture 16, projector lens 10, and detector 12 are arranged in this order along the optical axis A of the microscope 100 inside the electron optical column 18. The optical axis A of the microscope 100 is a virtual line connecting the centers of the lenses 4, 6, 8, and 10. The inside of the column 18 is evacuated by a vacuum pumping system (not shown).

The electron beam source 2 emits an electron beam L by accelerating electrons released from a cathode by means of an anode. A well-known electron gun can be used as the electron beam source 2.

The illumination lens 4 is used to direct the electron beam L generated by the electron beam source 2 toward a sample S. For example, the illumination lens 4 is made up of plural lens elements (not shown). The illumination lens 4 can adjust the dose of the electron beam hitting the sample S. The illumination lens 4 is controlled, for example, by the control portion 22 of the processing portion 20.

The condenser aperture 14 is located, for example, between the illumination lens 4 and the first objective lens 6. The condenser aperture 14 can adjust the angular aperture or dose of the electron beam L falling on the sample S.

The first objective lens 6 is disposed behind the illumination lens 4. The first objective lens 6 can produce a lens action by applying a magnetic field to the sample S and, thus, can image the electron beam L transmitted through the sample S, i.e., can form a TEM image. TEM images referred to herein are images such as diffraction patterns and real space images obtained by transmission electron microscopy. Real space images include bright field images and dark field images. A bright field image is created by detecting electrons of an electron beam which include electrons transmitted through a sample without being scattered by the sample and electrons scattered at small angles. A dark field image is created by detecting electrons of the electron beam which include electrons scattered by the sample and electrons diffracted by the sample when they are transmitted through the sample. The first objective lens 6 is controlled, for example, by the control portion 22.

An objective aperture (not shown) may be disposed at the back focal plane of the first objective lens 6.

The second objective lens 8 is disposed behind the first objective lens 6. The second objective lens 8 can form a TEM image from the electron beam L transmitted through the sample S. The second objective lens 8 can focus the TEM image, for example, at the object plane of the projector lens 10. The second objective lens 8 images a diffraction pattern of the sample S at a first plane 17 in which the selected area aperture 16 is disposed. The second objective lens 8 is controlled, for example, by the control portion 22.

Figure 2:
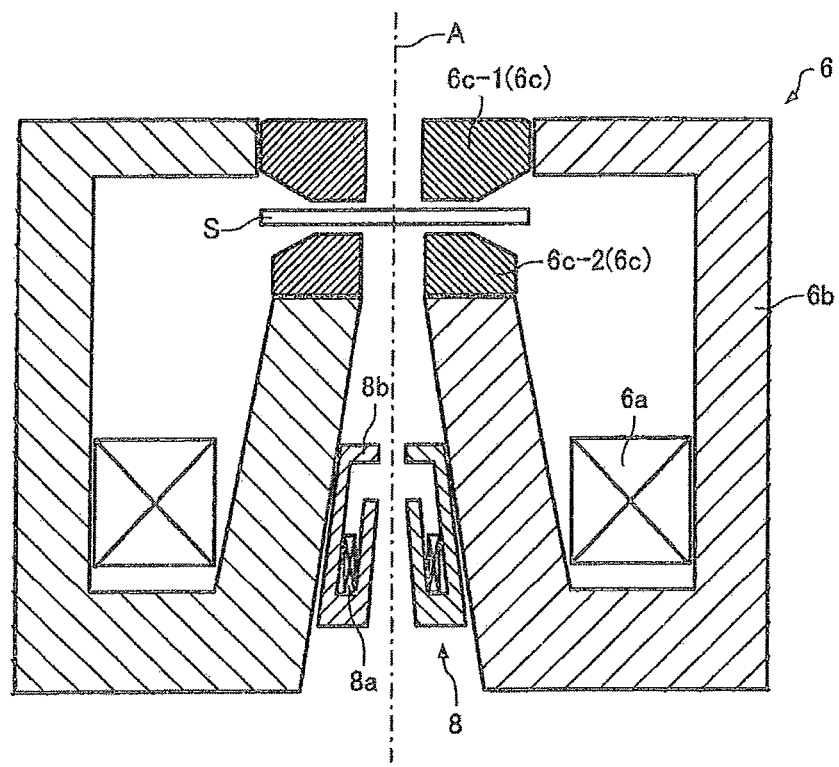
FIG. 2 is a schematic cross-sectional view of a first objective lens and a second objective lens mounted in the transmission electron microscope associated with the first embodiment.

FIG. 2 is a schematic cross section of the first objective lens 6 and second objective lens 8 of the transmission electron microscope 100.

As shown in FIG. 2, the first objective lens 6 is configured including a coil 6a, a yoke 6b, and polepieces 6c including an upper polepiece 6c-1 and a lower polepiece 6c-2. Magnetic flux produced by exciting the coil 6a is made to leak into the space from the polepieces 6c by the first objective lens 6 after passing through the yoke 6b. A strong magnetic field in rotational symmetry is produced between the upper polepiece 6c-1 and the lower polepiece 6c-2 and, therefore, the electron beam L can be condensed. The yoke 6b and the polepieces 6c may be fabricated integrally.

Referring still to FIG. 2, the sample S is placed between the upper polepiece 6c-1 and the lower polepiece 6c-2. Therefore, when the first objective lens 6 is excited, a strong magnetic field is applied to the sample S. The sample S is held between the upper polepiece 6c-1 and lower polepiece 6c-2, for example, by a sample stage (not shown). The sample stage can move the sample S in a horizontal direction perpendicular to the electron beam L and in a vertical direction along the beam L. Also, the sample stage can tilt the sample S.

As shown in FIG. 2, the second objective lens 8 is configured including the coil 8a and the yoke 8b. That is, the second objective lens 8 does not have any polepieces which would normally be used to strengthen the magnetic field. The second objective lens 8 is separated from the yoke 6b of the first objective lens 6 and operates independently of the first objective lens 6. The second objective lens 8 is spaced, for example, tens of mm from the first objective lens 6, and is at a distance from the sample S. Consequently, the effects of the magnetic field on the sample S when the second objective lens 8 should be excited are much smaller than the effects of the magnetic field on the sample S when the first objective lens 6 is excited.

As shown in FIG. 1, the selected area aperture 16 is disposed between the second objective lens 8 and the projector lens 10 and inserted in the first plane 17 perpendicular to the optical axis A. The selected area aperture 16 is a movable aperture whose diameters can be selected from plural values from the outside of the electron optical column 18. Also, the position of the aperture 16 can be controlled from the outside of the column. These selection and control may be performed, for example, by the processing portion 20. In this case, the transmission electron microscope 100 may have a drive mechanism (not shown) for moving the selected area aperture 16. The processing portion 20 may output a control signal to this drive mechanism, which in turn may move the aperture 16 in response to the control signal.

The selected area aperture 16 can restrict passage of the electron beam L transmitted through the sample S. When selected area diffraction is performed, for example, the selected area aperture 16 can select an area of the sample S from which a diffraction pattern will be obtained. As described later, the selected area aperture 16 can be used as an aperture for selecting transmitted waves or diffracted waves from a diffraction pattern of the sample S formed on the first plane 17 by the second objective lens 8.

The projector lens 10 is disposed behind the second objective lens 8. The projector lens 10 can magnify the TEM image formed by the first objective lens 6 or second objective lens 8 and focus the TEM image onto the light-sensitive portion 13. Furthermore, the projector lens 10 may have a function of adjusting the sense (angular position) of the TEM image. Consequently, the diffraction pattern and the real space image can be made coincident in sense. For example, the projector lens 10 is made up of plural lens elements. The projector lens 10 is controlled by the control portion 22.

The detector 12 has the light-sensitive portion 13 for detecting the electron beam L. For instance, the detector 12 is a CCD camera having the light-sensitive portion 13 made of CCD (charge-coupled device) elements arranged in two dimensions. The light-sensitive portion 13 is disposed at the imaging plane (second plane) of the projector lens 10. The detector 12 detects a TEM image focused onto the light-sensitive portion 13 and outputs information about the TEM image to the processing portion 20. In response to the information, the processing portion 20 can create a TEM image and display it on the display portion 32.

The manual control portion 30 permits a user to enter manual control information, and outputs the entered manual control information to the processing portion 20. The functions of the manual control portion 30 can be accomplished, for example, by hardware such as a keyboard, a mouse, or a touch panel display.

The display portion 32 is used to display the image created by the processing portion 20. The function of the display portion 32 can be realized by an LCD, a CRT, or the like. The display portion 32 displays, for example, a TEM image formed by the processing portion 20.

The storage portion 34 acts as the working area for the processing portion 20. The function of the storage portion 34 can be accomplished, for example, by a RAM. The information storage medium 36 that is a computer-readable medium is used to store computer programs and data. The function of the storage portion 34 can be realized by an optical disc (such as CD or DVD), magnetooptical disc (MO), a magnetic disc, a hard disc, or a memory (such as a ROM). The processing portion 20 performs various kinds of processing of the present embodiment based on a program stored on the information storage medium 36. A program for implementing a computer as various portions of the processing portion 20 can be stored on or in the information storage medium 36. Furthermore, data for setting the operative conditions of the lenses 4, 6, 8, and 10 constituting the transmission electron microscope 100 can be stored on or in the information storage medium 36.

The processing portion 20 performs operations for controlling the illumination lens 4, first objective lens 6, second objective lens 8, and projector lens 10 and operations for displaying the TEM image onto the display portion 32. Furthermore, the processing portion 20 may perform operations for controlling the diameter and position of the selected area aperture 16.

The functions of the processing portion 20 can be realized by hardware (such as various processors, e.g., CPU and DSP) or ASIC (such as gate array) or software. The processing portion 20 includes the control portion 22.

The control portion 22 can perform operations, for example, for controlling the illumination lens 4, first objective lens 6, second objective lens 8, and projector lens 10.

The mode of operation of the control portion 22 of the processing portion 20 can be switched between a first mode for performing first sets of processing and a second mode for performing second sets of processing.

The first sets of processing include an operation for controlling the illumination lens 4 such that the electron beam L hits the sample S and an operation for controlling the second objective lens 8 for bringing a diffraction pattern of the sample S into focus at the first plane 17 where the selected area aperture 16 is disposed. Furthermore, the first sets of processing include an operation for controlling the projector lens 10 such that the TEM image of the sample S formed by the second objective lens 8 is focused onto the light-sensitive surface 13 of the detector 12. In addition, during the first sets of processing, the control portion 22 can perform an operation for controlling the projector lens 10 such that the sense (angular position) of the TEM image focused onto the light-sensitive portion 13 of the detector 12 is adjusted. That is, in the first mode for performing the first sets of processing, a TEM image of the sample S can be obtained without exciting the first objective lens 6. Therefore, during observation, the effects of the magnetic field on the sample S can be reduced. Thus, the first mode is effective in cases where a sample is susceptible to the effects of a magnetic field such as a sample made of a magnetic substance is observed.

The second sets of processing include an operation for controlling the illumination lens 4 such that the electron beam L hits the sample S and an operation for controlling the first objective lens 6 such that the TEM image of the sample S is focused. Additionally, the second sets of processing include an operation for controlling the projector lens 10 such that the TEM image of the sample S formed by the first objective lens 6 is focused onto the light-sensitive portion 13 of the detector 12. That is, in the second mode for performing the second sets of processing, the first objective lens 6 is excited to obtain a TEM image of the sample S.

The transmission electron microscope 100 can select a desired mode of operation from the first and second modes according to the nature of the sample S, e.g., according to whether it is susceptible to the effects of the magnetic field. For example, the user can select a desired mode of operation by manipulating the manual control portion 30.

1.2. Processing of Transmission Electron Microscope

The processing performed by the processing portion of the transmission electron microscope associated with the first embodiment is next described. First, the first sets of processing performed by the processing portion 20 of the microscope 100 and their modifications are described. The second sets of processing will be next described.

1.2.1. First Sets of Processing

Figure 3:
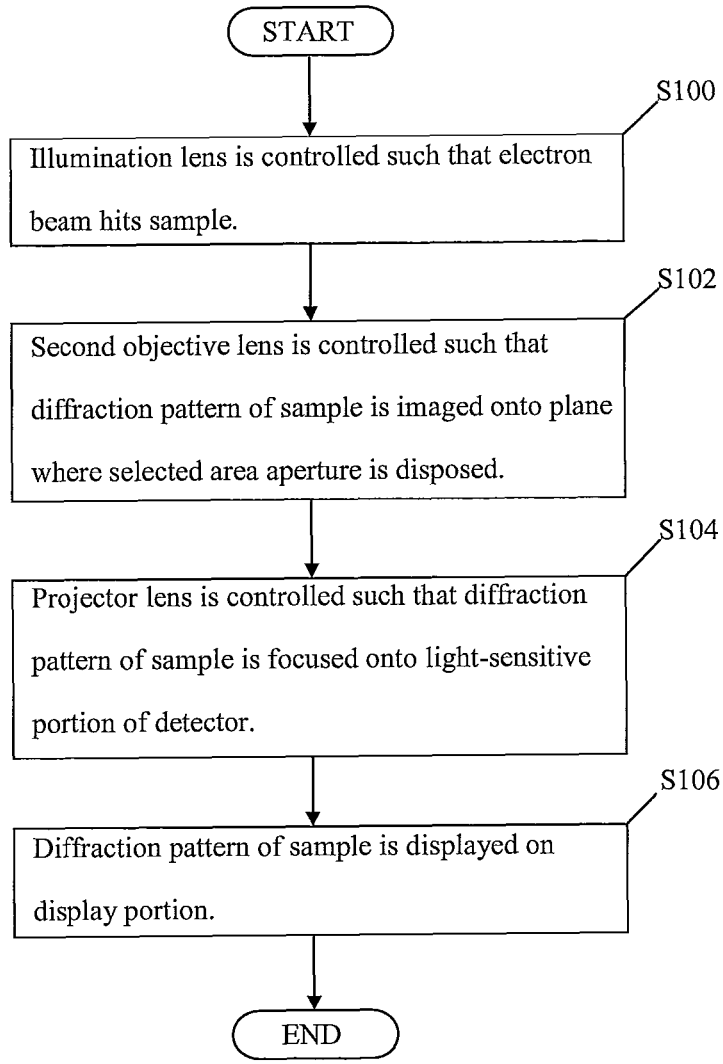
FIG. 3 is a flowchart illustrating a first example of first sets of processing including steps performed by a processing portion in the transmission electron microscope associated with the first embodiment.
Figure 4:
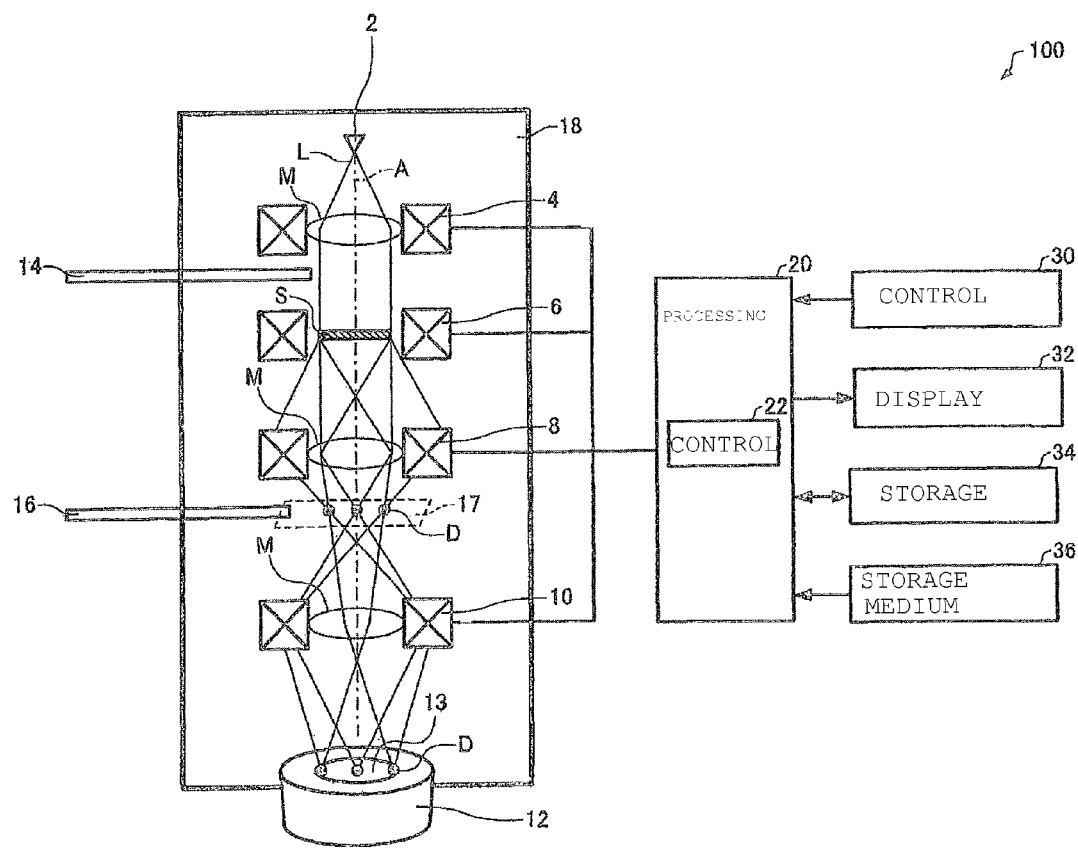
FIG. 4 is a vertical cross section, partly in block form, of the transmission electron microscope shown in FIG. 1, and in which the processing portion performs the first sets of processing in a first mode of operation.

The first sets of processing are first described. FIG. 3 is a flowchart illustrating one example of the first sets of processing including steps performed by the processing portion 20 of the transmission electron microscope 100. FIG. 4 is a vertical cross section, illustrating the operation of the microscope 100 when the processing portion 20 performs the first sets of processing in the first mode.

First, the control portion 22 controls the operation of the illumination lens 4 such that the electron beam L hits the sample S (step S100). In particular, the control portion 22 supplies a given amount of excitation current to the illumination lens 4 to excite the illumination lens 4. As a result, as shown in FIG. 4, the illumination lens 4 produces a magnetic field M, which in turn condenses the electron beam L. Because of this operation of the illumination lens 4, the dose of the electron beam L falling on the sample S can be adjusted. In addition to the illumination lens 4, the condenser aperture 14 may be used to adjust the dose and angular aperture of the electron beam L. The control portion 22 performs an operation for controlling the illumination lens 4, based on data stored on the information storage medium 36 used to set operative conditions of the illumination lens 4.

Then, the control portion 22 performs an operation for controlling the second objective lens 8 such that a diffraction pattern of the sample S is focused at the first plane 17 where the selected area aperture 16 is disposed (step S102). In particular, the control portion 22 supplies a given amount of excitation current to the coil 8a of the second objective lens 8 to excite the second objective lens 8, for producing the magnetic field M that condenses the electron beam L. As a result, as shown in FIG. 4, a diffraction pattern D of the sample S created by the electron beam L transmitted through the sample S can be imaged onto the first plane 17. For example, the control portion 22 performs the operation for controlling the second objective lens 8, based on data for setting the operative conditions of the second objective lens 8, the data being stored on the information storage medium 36.

The control portion 22 then performs an operation for controlling the projector lens 10 such that the diffraction pattern D of the sample S is imaged onto the light-sensitive portion 13 of the detector 12 (step S104). In particular, the control portion 22 supplies a given amount of excitation current to the projector lens 10 to excite the projector lens 10 for developing the magnetic field M which condenses the electron beam L.

In the example of FIG. 4, the control portion 22 controls the projector lens 10 such that the diffraction pattern D of the sample S focused onto the first plane 17 is imaged onto the light-receiving portion 13. That is, the control portion 22 controls the projector lens 10 such that the object plane of the projector lens 10 is established at the first plane 17. Furthermore, the control portion 22 can control the projector lens 10 according to the constituent elements of the sample S and the angle of tilt of the sample S relative to the optical axis A such that the diffraction pattern D imaged on the light-receiving portion 13 assumes a desired size corresponding to a desired camera length. Additionally, the control portion 22 can perform an operation for adjusting the sense (rotational angle) of the diffraction pattern D of the sample S imaged onto the light-receiving portion 13, using the projector lens 10. As a consequence, the sense of the sample S (sense of a real space image) can be brought into coincidence with the sense of the diffraction pattern D of the sample S.

The control portion 22 performs an operation for controlling the projector lens 10, for example, based on data for setting operative conditions of the projector lens 10, the data being stored on the information storage medium 36.

Then, the processing portion 20 performs an operation for displaying the diffraction pattern D of the sample S on the display portion 32 (step S106). Information about the diffraction pattern D of the sample S is output from the detector 12 and entered into the processing portion 20. The processing portion 20 performs an operation for displaying the diffraction pattern D of the sample S on the display portion 32, based on the information about the diffraction pattern D of the sample S. The processing portion 20 ends the sequence of steps.

In the above example, the control portion 22 performs the steps S100, S102, and S104 in this order. No restriction is imposed on the order in which these steps are carried out. For example, the control portion 22 may perform the steps S100, S102, and S104 at the same time.

Because of the first sets of processing, the diffraction pattern D can be imaged using the second objective lens 8 and projector lens 10. That is, the diffraction pattern D can be imaged without using the first objective lens 6. Accordingly, during observation of the diffraction pattern D of the sample S, the effects of the magnetic field on the sample S can be reduced.

1.2.2. First Modification of First Sets of Processing

Figure 5:
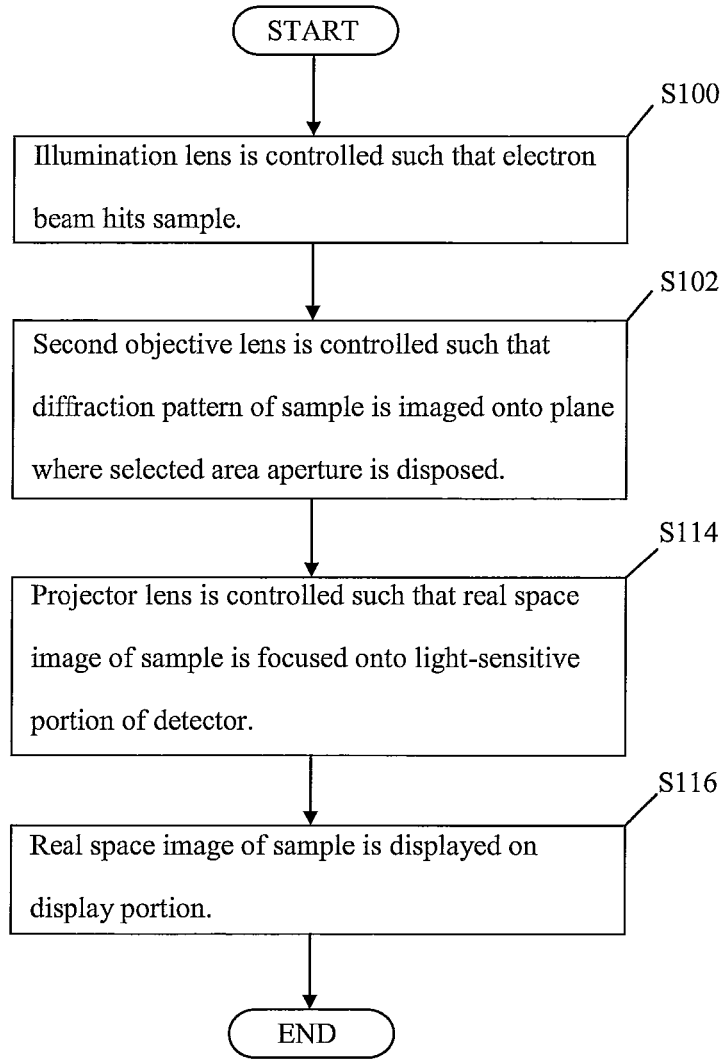
FIG. 5 is a flowchart illustrating one example of a first modification of the first sets of processing including steps performed by the processing portion of the transmission electron microscope associated with the first embodiment.
Figure 6:
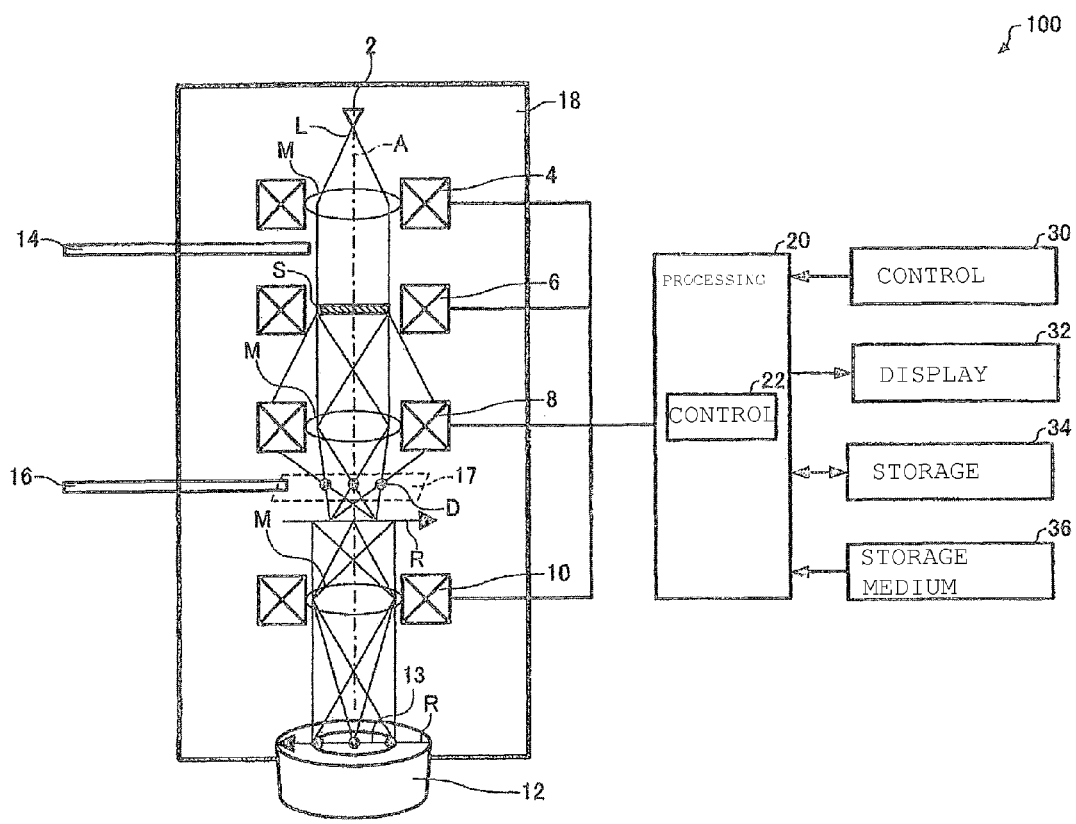
FIG. 6 is a vertical cross section similar to FIG. 4, but in which the processing portion performs the first modification of the first sets of processing.

A first modification of the first sets of processing is next described. FIG. 5 is a flowchart illustrating one example of the first modification of the first sets of processing including steps performed by the processing portion 20. FIG. 6 is a vertical cross section illustrating the operation of the transmission electron microscope 100 when the processing portion 20 performs the first modification of the first sets of processing. Those steps of FIG. 5, which are identical with the corresponding ones of the steps S100-S106 of FIG. 3, are indicated by the same reference numerals as in FIG. 3. A detailed description of the steps of the first modification which are identical with their counterparts of the first embodiment described already in connection with FIG. 3 is omitted below.

In the first sets of processing associated with the first embodiment already described in connection with FIG. 3, the processing portion 20 performs an operation for obtaining the diffraction pattern D of the sample S. In contrast, in the present modification, the processing portion 20 can perform an operation for obtaining a real space image.

More specifically, in the first sets of processing associated with the first embodiment already described in connection with FIG. 3, the processing portion 20 controls the projector lens 10 such that the diffraction pattern D of the sample S is imaged onto the light-sensitive portion 13 of the detector 12. In contrast, in the present modification, the processing portion 20 can control the projector lens 10 such that a real space image R of the sample S is focused onto the light-sensitive portion 13 of the detector 12 as shown in FIGS. 5 and 6.

First, the control portion 22 performs the aforementioned steps S100 and S102.

Then, the control portion 22 controls the projector lens 10 such that the real space image R of the sample S is focused onto the light-sensitive portion 13 of the detector 12 (step S114).

As shown in FIG. 6, the second objective lens 8 images the diffraction pattern D onto the first plane 17 and brings the real space image R onto a plane different from the first plane 17. The control portion 22 performs an operation for controlling the projector lens 10 such that the object plane of the projector lens 10 is a plane at which the real space image R focused by the second objective lens 8 is obtained. In consequence, the projector lens 10 can focus the real space image R of the sample S onto the light-receiving portion 13.

The processing portion 20 performs an operation for displaying the real space image R of the sample S detected by the detector 12 onto the display portion 32 (step S116). The processing portion 20 then ends the sequence of steps.

Because of the processing associated with the first modification, the real space image R can be focused using the second objective lens 8 and projector lens 10. Therefore, during observation of the real space image R, the effects of the magnetic field on the sample S can be reduced.

1.2.3. Second Modification of First Sets of Processing

Figure 7:
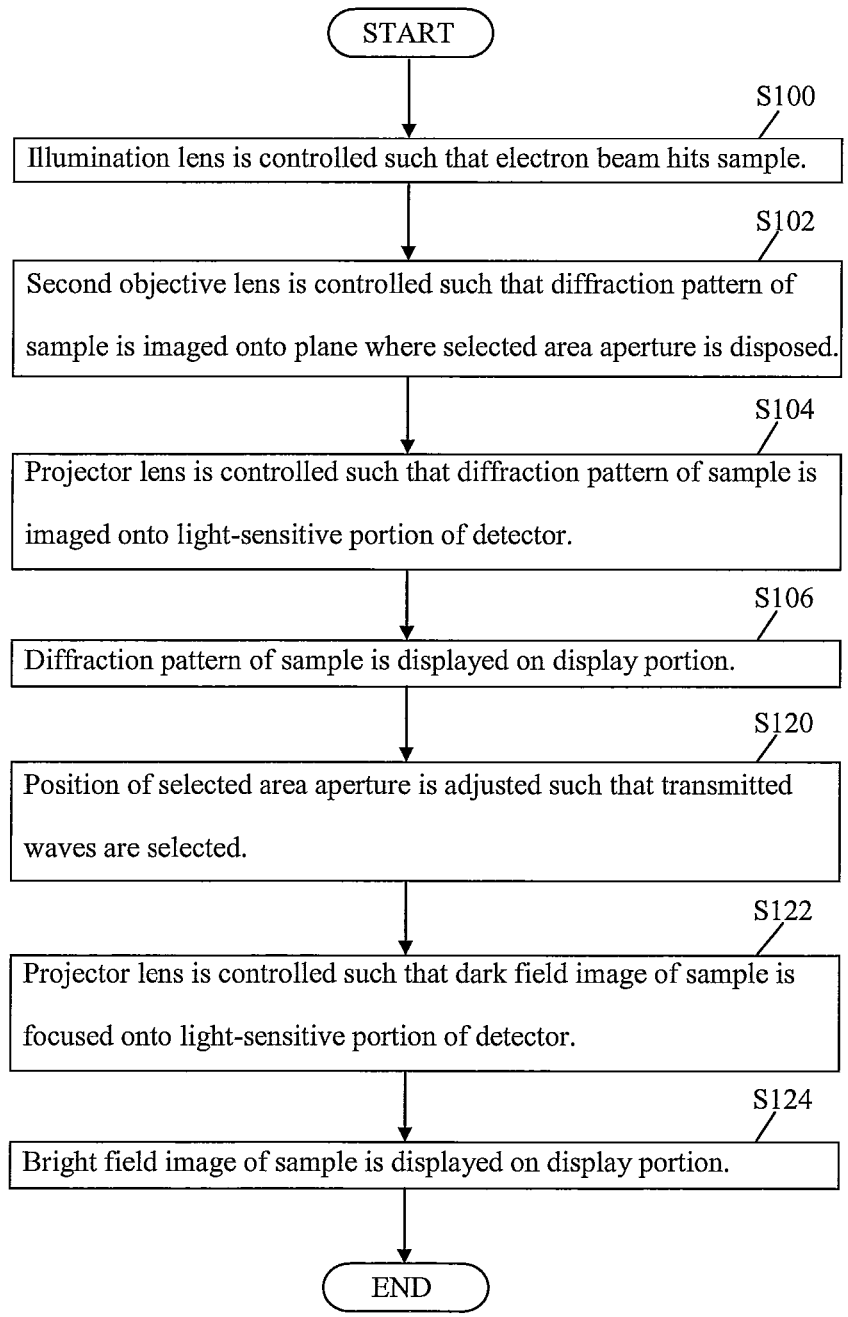
FIG. 7 is a flowchart illustrating one example of a second modification of the first sets of processing including steps performed by the processing portion of the transmission electron microscope associated with the first embodiment.
Figure 8:
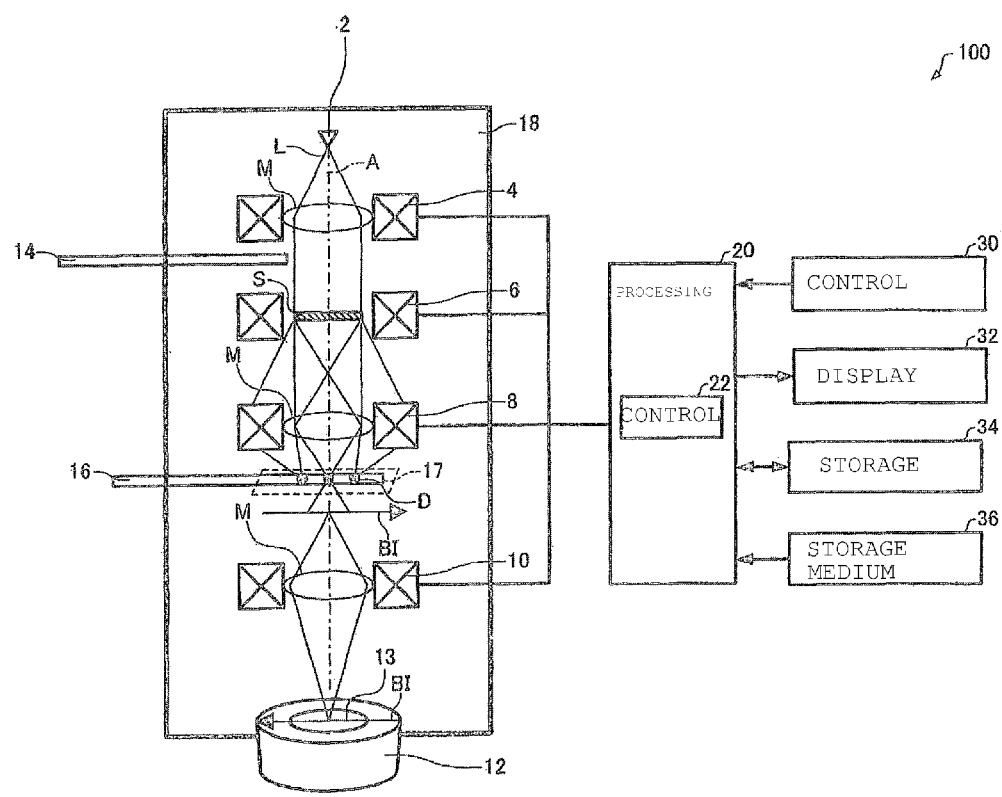
FIG. 8 is a vertical cross section similar to FIG. 6, but in which the processing portion performs a second modification of the first sets of processing.

A second modification of the first sets of processing is next described. FIG. 7 is a flowchart illustrating one example of the second modification of the first sets of processing including steps performed by the processing portion 20. FIG. 8 is a vertical cross section of the transmission electron microscope 100, illustrating its operation when the processing portion 20 performs the second modification of the first sets of processing. In FIGS. 7 and 3, identical processing steps S100 to S106 are indicated by identical reference numerals. A detailed description of those steps of the second modification, which are identical with their counterparts of the first embodiment or its first modification, is omitted below.

In the first sets of processing associated with the first embodiment already described in connection with FIG. 3, the processing portion 20 performs an operation for obtaining the diffraction pattern D of the sample S. In contrast, in the present modification, the processing portion 20 can perform an operation for obtaining a bright field image (BI).

First, the processing portion 20 performs the aforementioned steps S100, S102, S104, and S106 to display the diffraction pattern D of the sample S on the display portion 32.

Then, the processing portion 20 performs an operation for adjusting the position of the selected area aperture 16 such that transmitted waves of the diffraction pattern D are selected (step S120).

Figure 9:
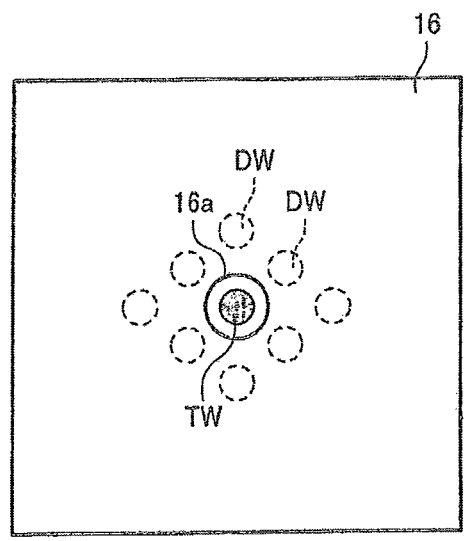
FIG. 9 is a plan view illustrating a technique of selecting transmitted waves out of a diffraction pattern using a selected area aperture.

FIG. 9 is a plan view illustrating a method of selecting the transmitted waves (TW) of the diffraction pattern D by the use of the selected area aperture 16. FIG. 9 is a plan view of the selected area aperture 16, as viewed from the direction of the optical axis A.

First, the processing portion 20 drives the drive mechanism (not shown) for moving the selected area aperture 16 to insert the aperture 16 into the first plane 17. At this time, the selected area aperture 16 is displayed on the display portion 32, together with the diffraction pattern D. Then, the processing portion 20 identifies the position of a hole 16a extending through the aperture 16 and the position of the transmitted waves TW from the image displayed on the display portion 32 and generates information indicating the positional relationship between the through-hole 16a and the transmitted waves TW. The processing portion 20 outputs the information about the positional relationship to the drive mechanism, which in turn moves the position of the selected area aperture 16 based on the information about the positional relationship such that the transmitted waves TW pass through the hole 16a in the aperture 16, i.e., to make the transmitted waves TW and the through-hole 16a coincident in position. As a result, as shown in FIG. 9, only the transmitted waves TW can pass through the hole 16a in the selected area aperture 16. That is, the transmitted waves TW can be selected. This technique permits the processing portion 20 to perform an operation for selecting the transmitted waves TW. As a result, as shown in FIG. 8, the bright field image BI of the sample S is formed.

In this example, the processing for selecting the transmitted waves TW is performed by the processing portion 20. Alternatively, the user may manually adjust the position of the selected area aperture 16 such that the transmitted waves TW pass through the hole 16a in the aperture 16, for example, while watching the diffraction pattern D and the aperture 16 displayed on the display portion 32.

Then, the control portion 22 performs an operation for controlling the projector lens 10 such that the bright field image BI of the sample S is focused onto the light-sensitive portion 13 of the detector 12 (step S122). Consequently, the detector 12 can detect the bright field image BI.

The processing portion 20 then performs an operation for displaying the bright field image BI of the sample S detected by the detector 12 on the display portion 32 (step S124). The processing portion 20 then ends the sequence of steps.

Because of the processing associated with the second modification, the bright field image BI can be focused using the second objective lens 8 and projector lens 10. Therefore, during observation of the bright field image BI, the effects of the magnetic field on the sample S can be reduced.

1.2.4. Third Modification of First Sets of Processing

Figure 10:
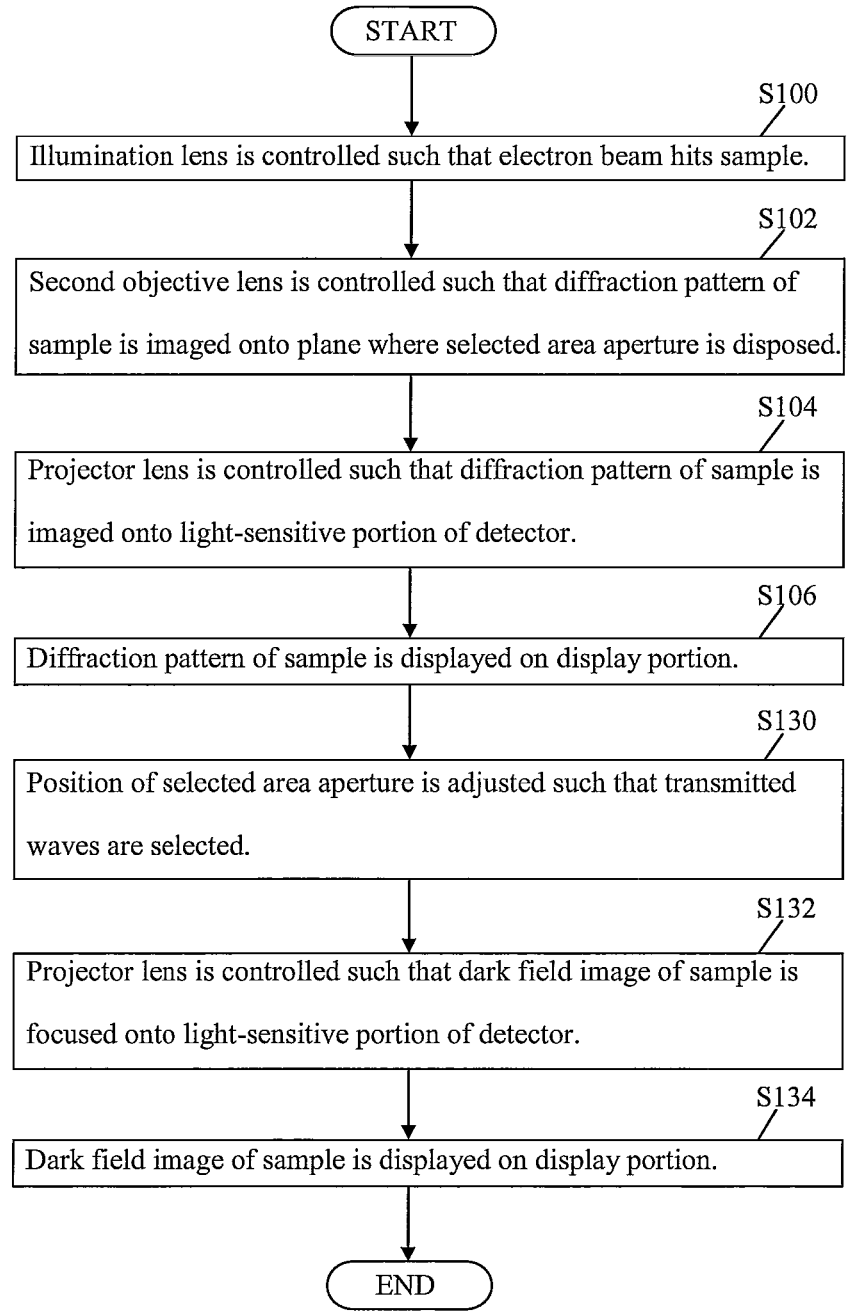
FIG. 10 is a flowchart illustrating one example of a third modification of the first sets of processing including steps performed by the processing portion of the transmission electron microscope associated with the first embodiment.
Figure 11:
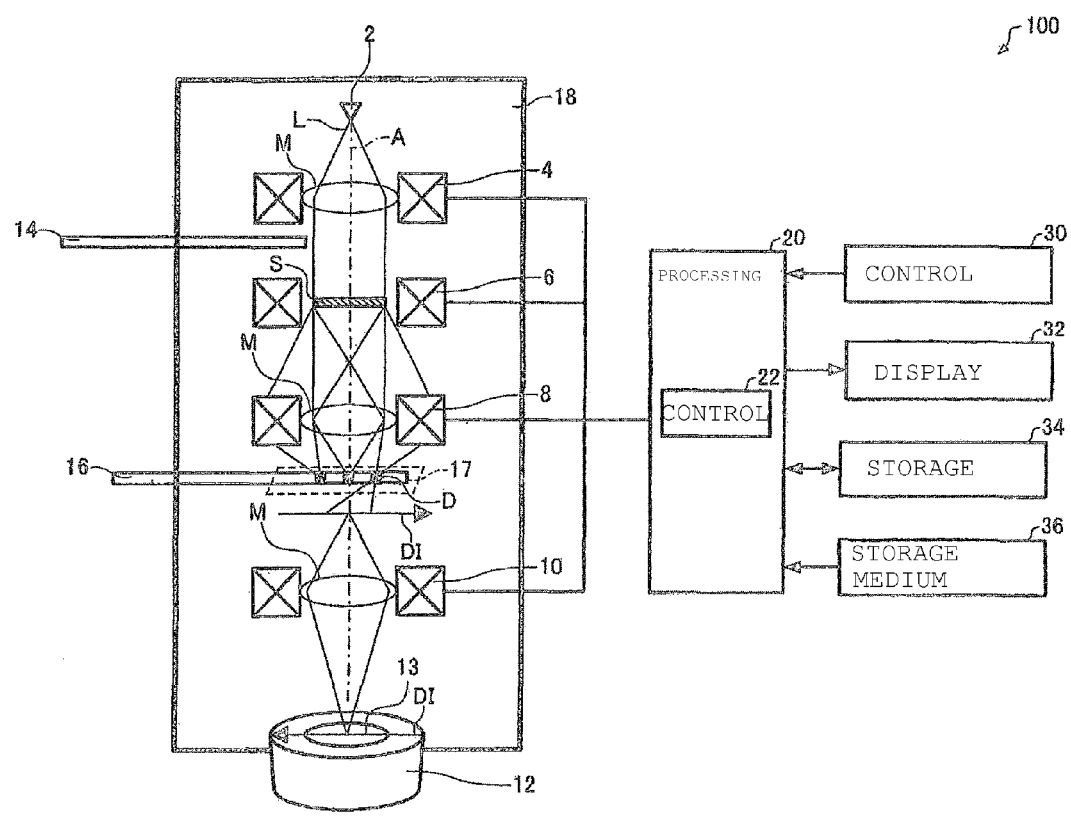
FIG. 11 is a vertical cross section similar to FIG. 8, but in which the processing portion performs the third modification of the first sets of processing.

A third modification of the first sets of processing is next described. FIG. 10 is a flowchart illustrating one example of the third modification of the first sets of processing including steps performed by the processing portion 20. FIG. 11 is a vertical cross section illustrating the operation of the transmission electron microscope 100 when the third modification of the first sets of processing is performed by the processing portion 20. In FIGS. 10 and 3, identical processing steps S100 to S106 are indicated by identical reference numerals. A detailed description of those steps of the third modification, which are similar to their counterparts of the above-described first embodiment, first modification, or second modification, is omitted below.

In the first sets of processing associated with the first embodiment already described in connection with FIG. 3, the processing portion 20 performs an operation for obtaining the diffraction pattern D of the sample S. In contrast, in the present modification, the processing portion 20 can perform an operation for obtaining a dark field image (DI).

First, the processing portion 20 effects the above-described steps S100, S102, S104, and S106 to display the diffraction pattern D of the sample S on the display portion 32.

The processing portion 20 then performs an operation for adjusting the position of the selected area aperture 16 to select the diffracted waves (DW) of the diffraction pattern D (step S130).

Figure 12:
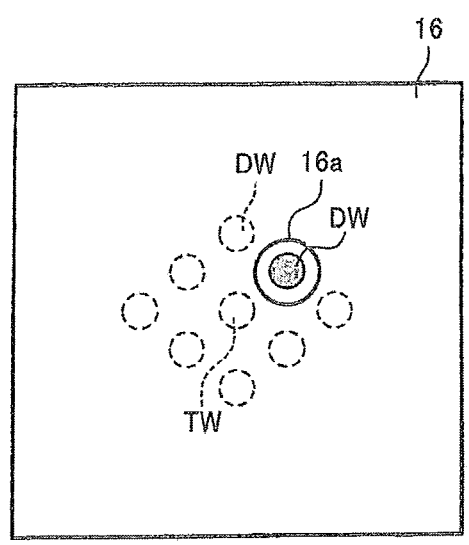
FIG. 12 is a plan view similar to FIG. 9, but illustrating a technique of selecting diffracted waves out of a diffraction pattern using the selected area aperture.

FIG. 12 is a plan view illustrating a technique of selecting the diffracted waves DW of the diffraction pattern D by the use of the selected area aperture 16. FIG. 12 is a plan view of the selected area aperture 16, as viewed from the direction of the optical axis A.

First, the processing portion 20 drives the drive mechanism (not shown) for moving the selected area aperture 16 to insert it into the first plane 17. At this time, the selected area aperture 16 is displayed on the display portion 32, along with the diffraction pattern D. Then, the processing portion 20 identifies the position of the hole 16a extending through the aperture 16 and the position of the given diffracted waves DW from the image displayed on the display portion 32 and generates information about the positional relationship between the through-hole 16a and the diffracted waves DW. The processing portion 20 outputs the information about the positional relationship to the drive mechanism, which in turn moves the position of the selected area aperture 16 based on the information about the positional relationship such that the diffracted waves DW pass through the hole 16a in the aperture 16 (i.e., the position of the diffracted waves DW is brought into coincidence with the position of the through-hole 16a). As a result, as shown in FIG. 11, only the given diffracted waves DW can pass through the hole 16a in the selected area aperture 16. That is, only the diffracted waves DW can be selected. This technique permits the processing portion 20 to perform an operation for selecting the given diffracted waves DW. As a result, as shown in FIG. 11, the dark field image DI of the sample S is formed. Information about the selected diffracted waves DW may be previously stored, for example, in the storage portion 34.

In this example, the operation for selecting the diffracted waves DW is performed by the processing portion 20. Alternatively, the user may manually adjust the position of the selected area aperture 16 such that the diffracted waves DW pass through the hole 16a in the aperture 16, for example, while watching the diffraction pattern D and the aperture 16 displayed on the display portion 32.

The control portion 22 then performs an operation for controlling the projector lens 10 such that the dark field image DI of the sample S is focused onto the light-sensitive portion 13 of the detector 12 (step S132). Consequently, the detector 12 can detect the dark field image DI.

The processing portion 20 then performs an operation for displaying the dark field image DI of the sample S, for example, detected by the detector 12 on the display portion 32 (step S134). The processing portion 20 ends the sequence of steps.

Because of the implementation of the third modification, the dark field image DI can be focused using the second objective lens 8 and projector lens 10. Accordingly, during observation of the dark field image DI, the effects of the magnetic field on the sample S can be reduced.

1.2.5. Second Sets of Processing

Figure 13:
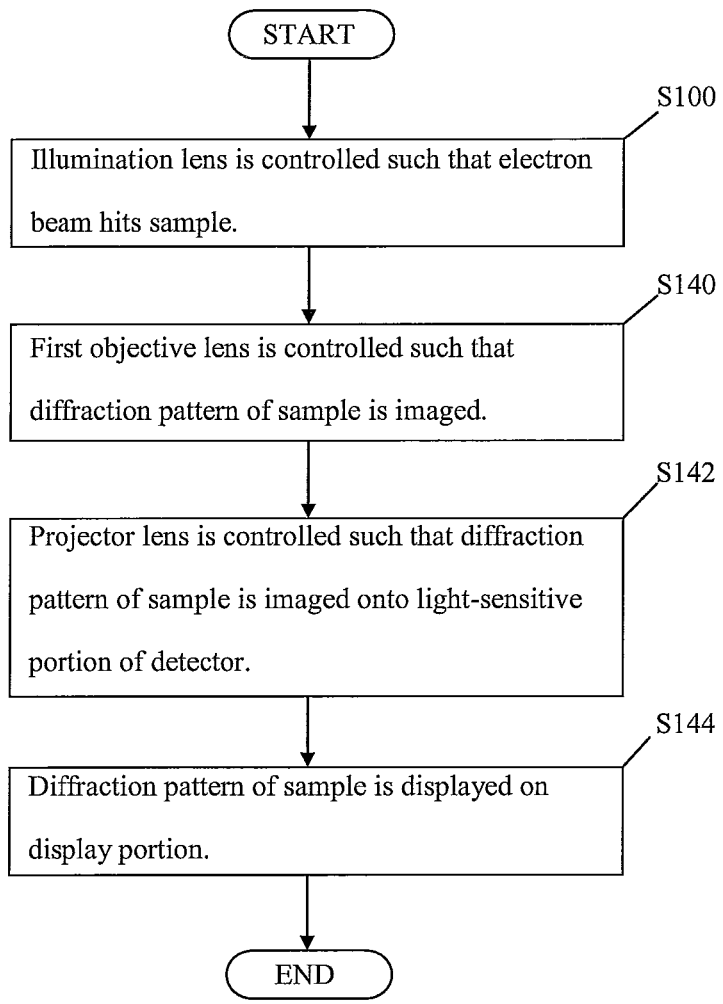
FIG. 13 is a flowchart illustrating one example of second sets of processing including steps performed by the processing portion of the transmission electron microscope associated with the first embodiment.
Figure 14:
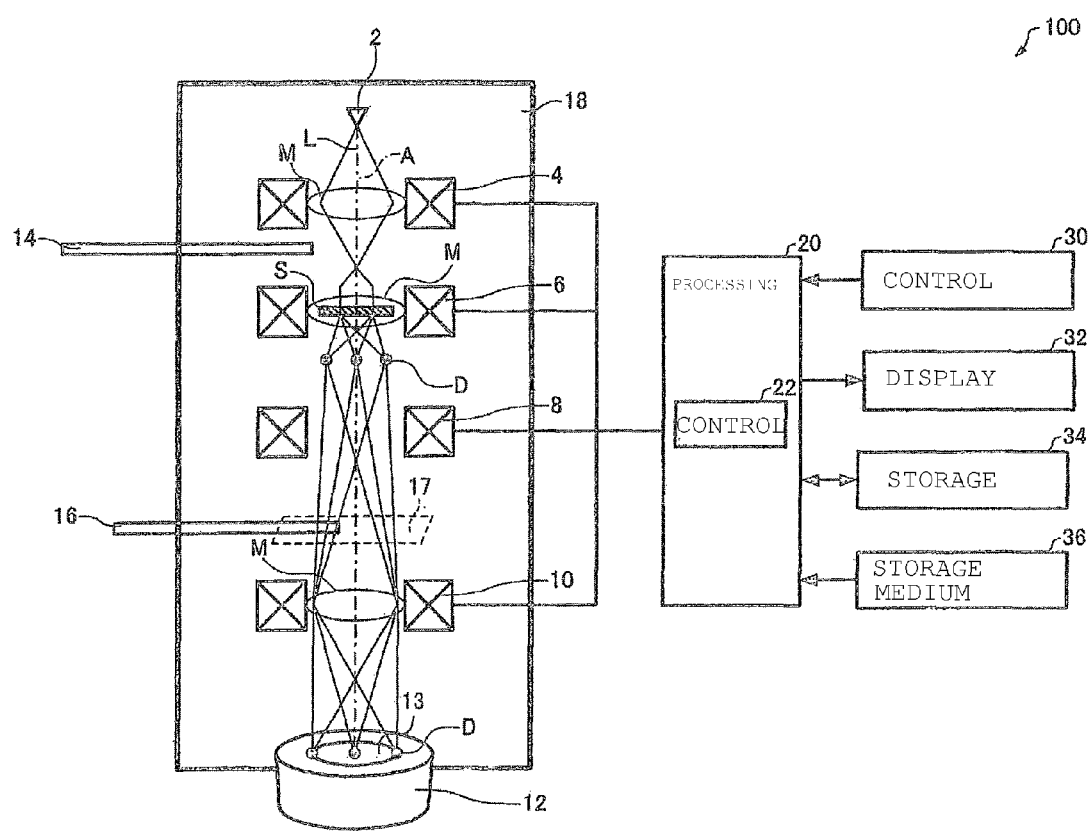
FIG. 14 is a vertical cross section similar to FIG. 11, but in which the processing portion performs the second sets of processing in a second mode of operation.

The second sets of processing are next described. FIG. 13 is a flowchart illustrating one example of the second sets of processing including steps performed by the processing portion 20 of the transmission electron microscope associated with the first embodiment. FIG. 14 is a vertical cross section illustrating the operation of the transmission electron microscope 100 when the processing portion 20 performs the second sets of processing in the second mode. In FIG. 13, that step which is identical with its counterpart out of the processing steps S100 to S106 of FIG. 3 is indicated by the same reference numeral as in FIG. 3. A detailed description of that step, which is similar to its counterpart of the first sets of processing already described in connection with FIG. 3, is omitted below.

First, the control portion 22 performs an operation for controlling the illumination lens 4 such that the electron beam L impinges on the sample S (step S100).

The control portion 22 then performs an operation for controlling the first objective lens 6 such that the diffraction pattern D of the sample S is imaged (step S140). In particular, the control portion 22 supplies a given amount of excitation current to the coil 6a of the first objective lens 6 to excite it. As a result, as shown in FIG. 14, the diffraction pattern D of the sample S can be imaged, for example, onto the object plane of the projector lens 10. The magnetic field M is applied to the sample S by exciting the first objective lens 6.

The control portion 22 then controls the projector lens 10 such that the diffraction pattern D of the sample S is imaged onto the light-sensitive portion 13 of the detector 12 (step S142).

The processing portion 20 then performs an operation for displaying the diffraction pattern D of the sample S, for example, detected by the detector 12 onto the display portion 32 (step S144). The processing portion 20 ends the sequence of steps.

By selecting an area of the sample S using the selected area aperture 16, a diffraction pattern D of this area can be observed. In particular, the processing portion 20 controls the drive mechanism (not shown) to adjust the position of the selected area aperture 16 such that the given area of the sample S is selected. In consequence, the diffraction pattern D of the given area of the sample S can be obtained. This technique is known as selected-area electron beam diffraction. Under the condition where the diffraction pattern D has been obtained, a real space image of this area can be obtained by causing the control portion 22 to hold the operative conditions of the first objective lens 6 and to control the projector lens 10 such that the object plane of the projector lens 10 is focused onto the plane where the real space image is formed. Data correlating the diffraction pattern D with the real space image can be obtained through the use of selected-area electron beam diffraction in this way.

The second sets of processing permit a TEM image of the sample such as the diffraction pattern D and a real space image to be imaged using the first objective lens 6 and the projector lens 10.

The transmission electron microscope 100 and TEM image observation method associated with the present embodiment have the following features.

The transmission electron microscope 100 associated with the present embodiment can form TEM images (such as diffraction pattern D, real space image R, bright field image BI, and dark field image DI) of the sample S by performing the first sets of processing by means of the control portion 22 of the processing portion 20 using the second objective lens 8 and projector lens 10 as described previously. That is, even if the first objective lens 6 is not used, a focused TEM image can be formed. Therefore, during observation of TEM images, the effects of the magnetic field on the sample S can be reduced compared with the case where the first objective lens 6 is used. This makes it possible to observe a TEM image of a sample, for example, susceptible to the effects of a magnetic field without affecting the internal state of the sample.

In the transmission electron microscope 100 associated with the present embodiment, the control portion 22 of the processing portion 20 can operate in the first mode where the aforementioned first sets of processing are performed and in the second mode where the second sets of processing are performed. Thus, where the sample S susceptible to the effects of a magnetic field is observed, for example, the processing portion 20 can operate in the first mode. Where the sample S unsusceptible to the effects of a magnetic field is observed, the processing portion can operate in the second mode. Accordingly, the TEM 100 can operate in a mode of operation selected according to the sample to be observed, e.g., according to whether the sample is susceptible to the effects of a magnetic field.

In the transmission electron microscope 100 associated with the present embodiment, the control portion 22 can perform an operation for adjusting the sense (angular position) of the diffraction pattern D of the sample S imaged onto the light-sensitive portion 13 or the sense of the real space image R using the projector lens 10. Furthermore, the sense of the sample S can be brought into coincidence with the sense of a TEM image (sense of a diffraction pattern D or sense of a real space image R). In addition, the diffraction pattern D and the real space image R can be made coincident in sense.

According to the TEM image observation method associated with the present embodiment, a focused TEM image (such as diffraction pattern D, real space image R, bright field image BI, or dark field image DI) of the sample S can be obtained using the second objective lens 8 and projector lens 10. That is, a focused TEM image can be derived if the first objective lens 6 is not used. Accordingly, during observation of TEM images, it is possible to reduce the effects of the magnetic field on the sample S.

2. Second Embodiment 2.1. Configuration of Transmission Electron Microscope

Figure 15:
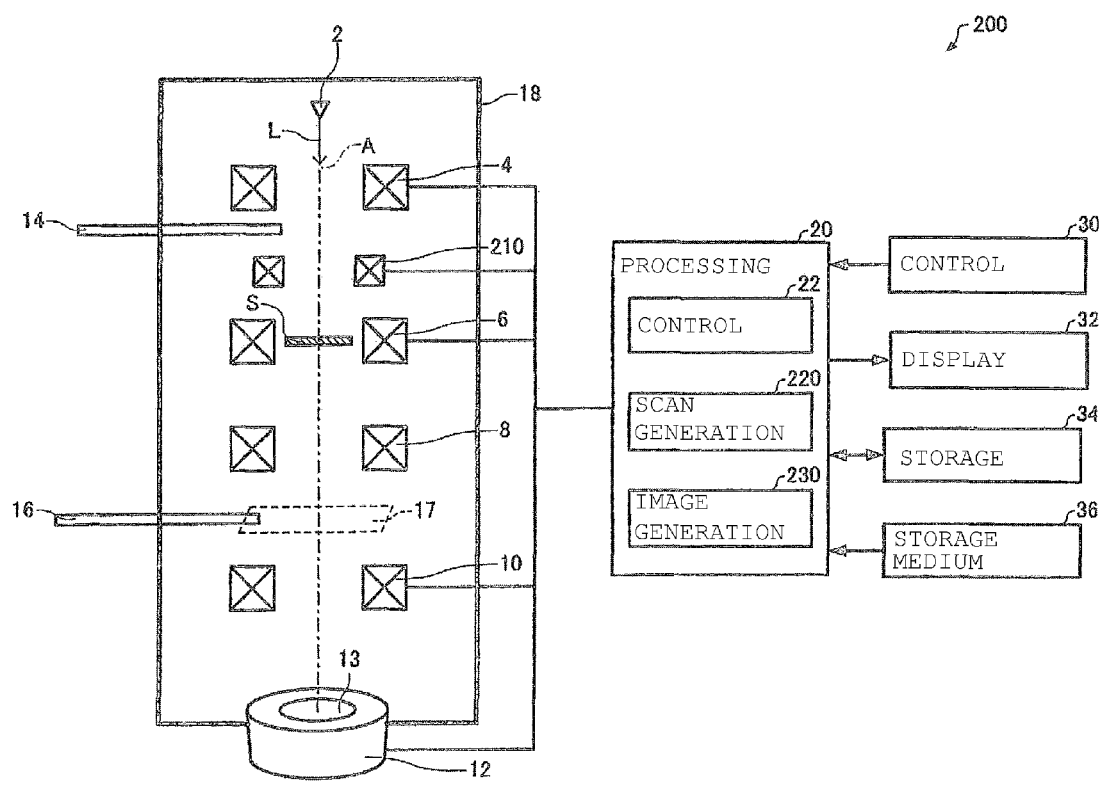
FIG. 15 is a vertical cross section, partly in block form, of a transmission electron microscope associated with a second embodiment of the present invention, showing the configuration of the microscope.

The configuration of a transmission electron microscope 200 associated with a second embodiment of the present invention is next described. FIG. 15 is a vertical cross section showing the configuration of the transmission electron microscope 200 associated with the second embodiment. Those components of the transmission electron microscope 200, which are functionally similar with their counterparts of the above-described transmission electron microscope 100 and are indicated by the same reference numerals as in the already referenced figures and their detailed description, is omitted below.

The transmission electron microscope 200 has the components of the transmission electron microscope 100 shown in FIG. 1. In addition, the microscope 200 is configured including scan coils 210, a scan signal generation portion 220, and a scanned image generation portion 230 as shown in FIG. 15. The microscope 200 is a scanning transmission electron microscope.

The scan signal generation portion 220 and scanned image generation portion 230 are incorporated within the processing portion 20 in the illustrated example. Alternatively, the scan signal generation portion 220 and scanned image generation portion 230 may be mounted not within but independent of the processing portion 20.

The scan coils 210 are disposed behind the illumination lens 4 and located between the illumination lens 4 and the first objective lens 6. The scan coils 210 scan the sample S with the electron beam L emerging from the illumination lens 4. The scan coils 210 scan the beam L based on a scan signal generated by the scan signal generation portion 220.

The scan signal generation portion 210 performs an operation for generating the scan signal, which corresponds to positional information on the sample S. The scan signal generation portion 210 performs an operation for entering the scan signal into the scan coils 210.

The scanned image generation portion 230 performs an operation for imaging the output signal (detection signal) from the detector 12 indicative of the intensity of the electron beam L in synchronism with the scan signal, thus forming a scanned image. A scanned image is an image showing a distribution of the amount of a signal (intensities of an electron beam) at each sample position, the distribution being obtained in synchronism with a scan signal. Scanned images are derived by a transmission electron microscope, and are included in TEM images. The scanned image generation portion 230 performs an operation for displaying a scanned image on the display portion 32.

2.2. Processing of Transmission Electron Microscope

The processing performed by the processing portion of a transmission electron microscope associated with a second embodiment is next described. First sets of processing performed by the processing portion 20 of the transmission electron microscope 200 and its modifications are first described. Then, second sets of processing will be described.

2.2.1. First Sets of Processing

Figure 16:
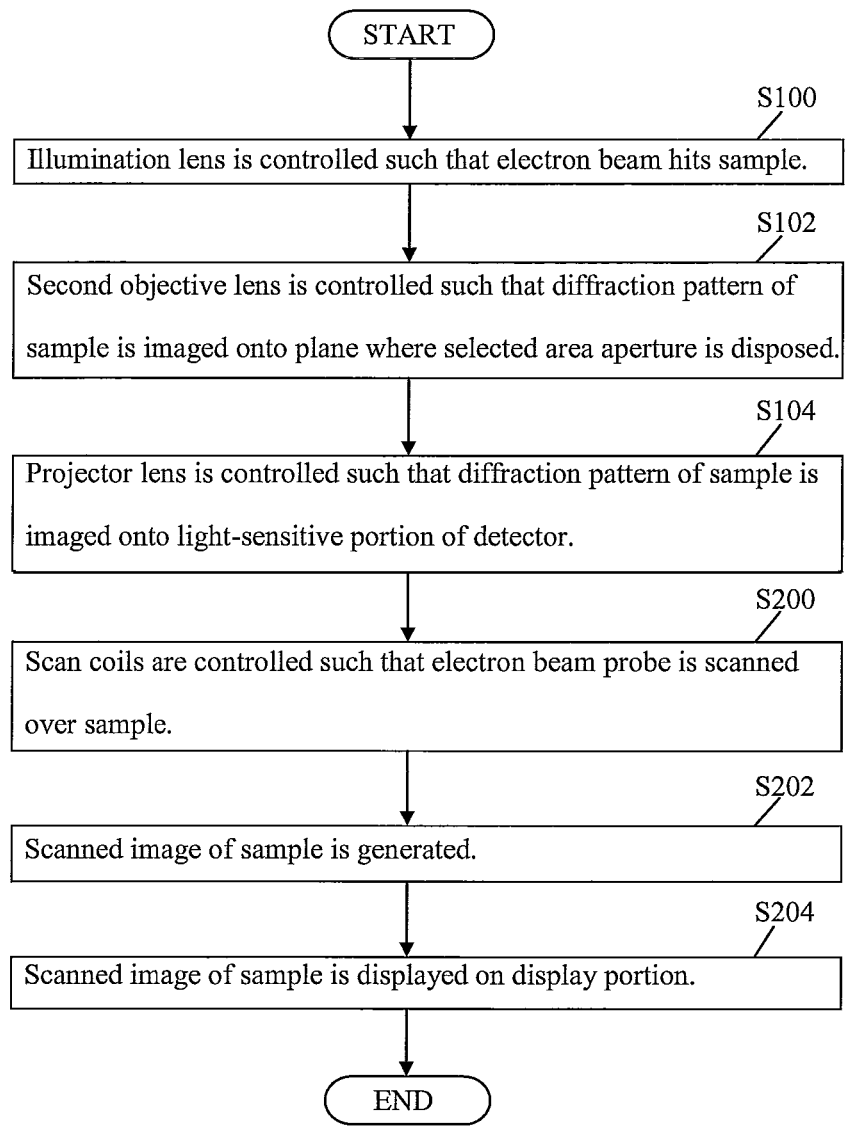
FIG. 16 is a flowchart illustrating one example of first sets of processing including steps performed by the processing portion of the transmission electron microscope associated with the second embodiment.
Figure 17:
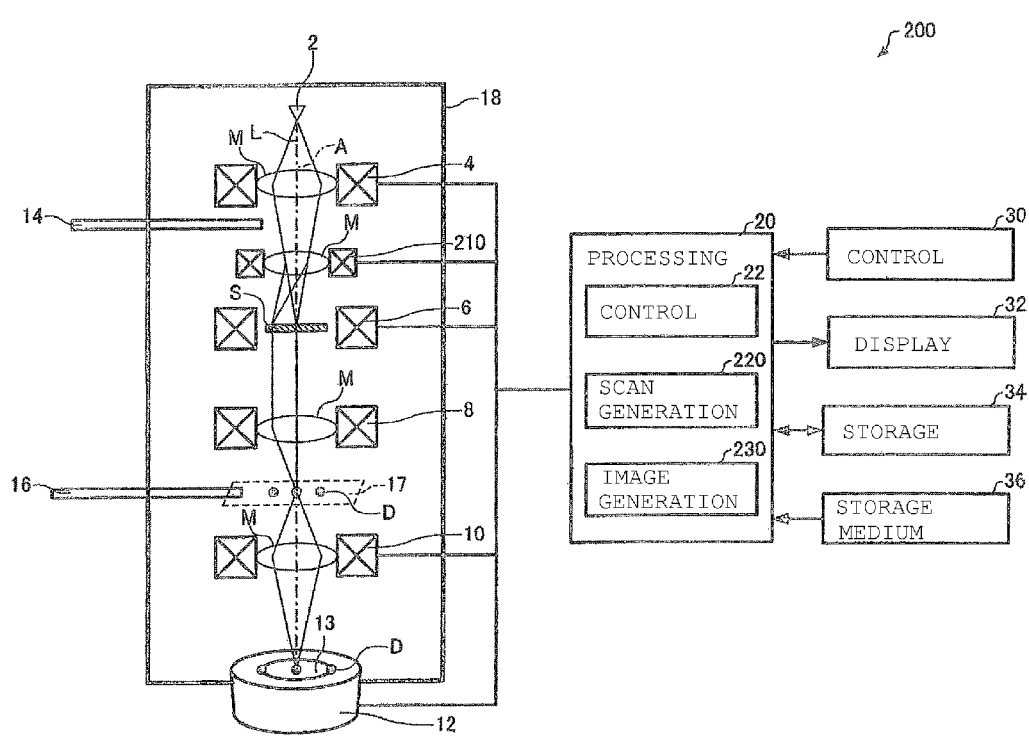
FIG. 17 is a vertical cross section similar to FIG. 15, but in which the processing portion performs the first sets of processing in a first mode of operation.

First, the first sets of processing are described. FIG. 16 is a flowchart illustrating one example of the first sets of processing including steps performed by the processing portion 20 of the transmission electron microscope 200 associated with the second embodiment. FIG. 17 is a vertical cross section illustrating the operation of the microscope 200 when the processing portion 20 performs the first sets of processing in the first mode. Those steps of FIG. 16, which are similar in operation with their counterparts of the steps S100 to S106 of FIG. 3, are indicated by the same reference numerals as in FIG. 3. A detailed description of operations similar to their counterparts of the first embodiment already described in connection with FIG. 3 is omitted below.

First, the control portion 22 performs an operation for controlling the illumination lens 4 such that the electron beam L hits the sample S (step S100). In particular, the control portion 22 performs an operation for controlling the illumination lens 4 in such a way that a sharply focused electron beam probe is formed over the sample S from the electron beam L.

Then, the control portion 22 performs an operation for controlling the second objective lens 8 such that the diffraction pattern D of the sample S is imaged onto the first plane 17 at which the selected area aperture 16 is placed (step S102). Consequently, as shown in FIG. 17, the diffraction pattern D of the sample S created by the electron beam L transmitted through the sample S can be imaged onto the first plane 17.

The control portion 22 then performs an operation for controlling the projector lens 10 such that the diffraction pattern D of the sample S is imaged onto the light-sensitive portion 13 of the detector 12 (step S104). The control portion 22 also performs an operation for controlling the projector lens 10 such that the object plane of the projector lens 10 is established at the first plane 17.

The scan signal generation portion 220 then performs an operation for generating a scan signal to control the scan coils 210 such that the electron beam probe emanating from the electron beam L is scanned over the sample S (step S200). In particular, the scan signal generation portion 220 generates a scan signal corresponding to each position on the sample S and enters the signal to the scan coils 210. The coils 210 scan the electron probe made of the electron beam L over the sample S in response to the scan signal.

The scanned image generation portion 230 then performs an operation for generating a scanned image of the sample S (step S202).

The detection signal containing information about the intensity of the electron beam from the detector 12 is applied to the scanned image generation portion 230. Also, the scan signal from the scan signal generation portion 220 is applied to the scanned image generation portion 230. The scanned image generation portion 230 performs an operation for synchronizing the detection signal and scan signal and generating a scanned image of the sample S, the scanned image indicating a distribution of amounts of signal (intensities of the electron beam) at each sample position.

Then, the scanned image generation portion 230 performs an operation for displaying the generated scanned image of the sample S on the display portion 32 (step S204). The processing portion 20 ends the sequence of steps.

In the above example, the processing portion 20 performs the steps S100, S102, S104, S200, S202, and S204 in this order. No restriction is imposed on the order in which these steps are executed. For example, the processing portion 20 may perform these steps at the same time.

Because of the first sets of processing, the diffraction pattern D can be imaged using the second objective lens 8 and projector lens 10, i.e., without using the first objective lens 6. Accordingly, during observation of the diffraction pattern D and scanned image of the sample S, the effects of the magnetic field on the sample S can be reduced.

2.2.2. First Modification of First Sets of Processing

Figure 18:
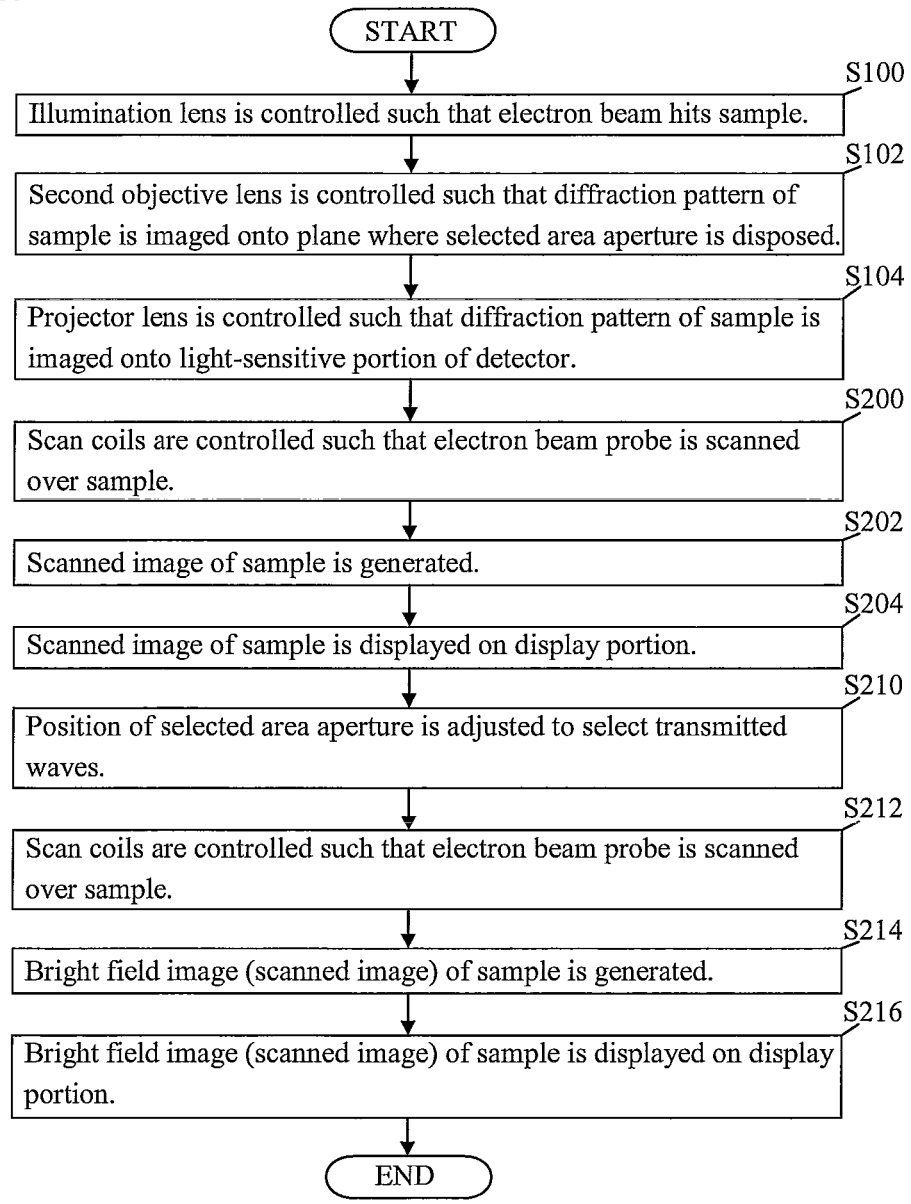
FIG. 18 is a flowchart illustrating one example of a first modification of the first sets of processing including steps performed by the processing portion of the transmission electron microscope associated with the second embodiment.
Figure 19:
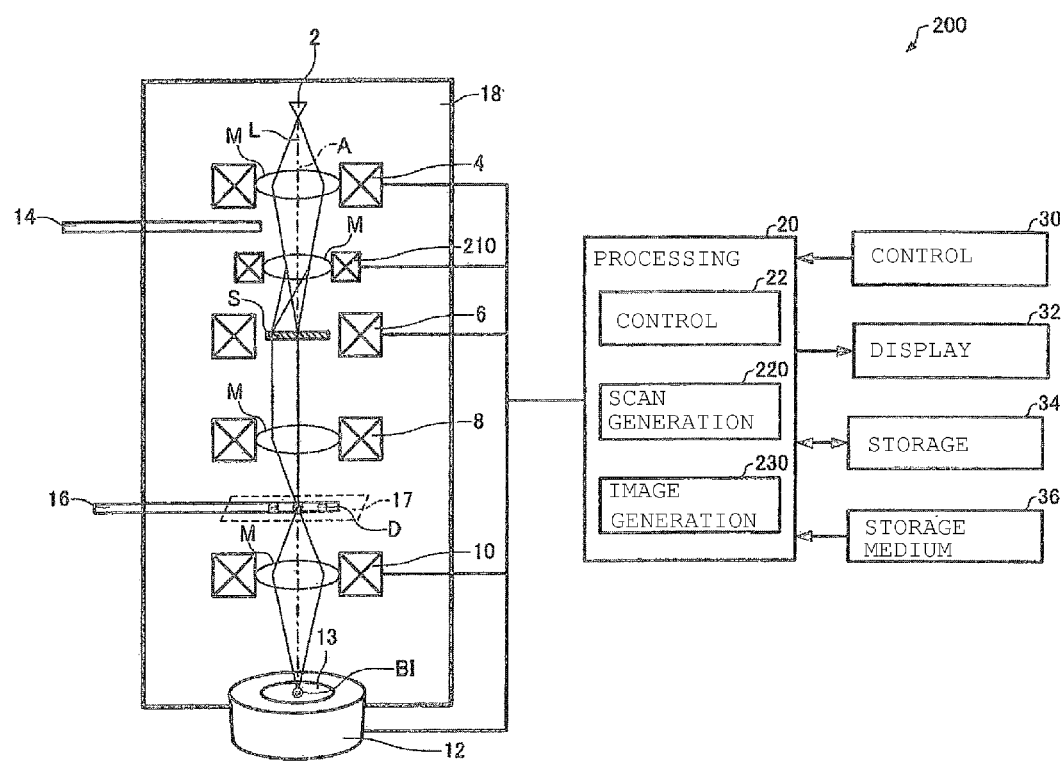
FIG. 19 is a vertical cross section similar to FIG. 17, but in which the processing portion performs the first modification of the first sets of processing.

A first modification of the first sets of processing is next described. FIG. 18 is a flowchart illustrating one example of the first modification of the first sets of processing including steps performed by the processing portion 20. FIG. 19 is a vertical cross section illustrating the operation of the transmission electron microscope 200 when the processing portion 20 performs the first modification of the first sets of processing. In FIG. 18, those steps which are similar in operation with their counterparts (S100 to S104 and S200 to S204) of FIG. 16 are indicated by the same reference numerals as in FIG. 16. A detailed description of operations of the first modification, which are similar to their counterparts of the second embodiment already described in connection with FIG. 16, is omitted below.

In the first sets of processing associated with the second embodiment already described in connection with FIG. 16, the processing portion 20 performs an operation for obtaining the diffraction pattern D of the sample S. In contrast, in the present modification, the processing portion 20 can perform an operation for obtaining a bright field image BI (scanned image).

First, the processing portion 20 performs the above-described steps S100, S102, S104, S200, S202, and S204 to display the scanned image of the sample S on the display portion 32.

Then, the processing portion 20 performs an operation for adjusting the position of the selected area aperture 16 to select transmitted waves of the diffraction pattern D (step S210). The processing portion 20 performs processing similar to the step S120 illustrated in FIG. 7 to adjust the position of the aperture 16 such that the transmitted waves are selected.

The scan signal generation portion 220 performs an operation for generating a scan signal to control the scan coils 210 such that the electron beam probe arising from the electron beam L is scanned over the sample S (step S212).

The scanned image generation portion 230 then performs an operation for generating a bright field image BI (scanned image) of the sample S (step S214).

The detection signal from the detector 12, which includes information about the intensity of the electron beam, is applied to the scanned image generation portion 230. Also, the scanned signal from the scan signal generation portion 220 is applied to the scanned image generation portion 230. The scanned image generation portion 230 performs an operation for synchronizing the detection signal and scan signal and generating a scanned image of the sample S, the scanned image indicating a distribution of amounts of signal (intensities of the electron beam) at each sample position. In this example, the scanned image of the sample S corresponds to the bright field image BI of the sample S.

The scanned image generation portion 230 then performs an operation for displaying the generated bright field image BI (scanned image) of the sample S on the display portion 32 (step S216). The processing portion 20 ends the sequence of steps.

Because of execution of the first modification, the bright field image BI (scanned image) can be focused using the second objective lens 8 and projector lens 10. Accordingly, during observation of the bright field image BI (scanned image) of the sample S, the effects of the magnetic field on the sample S can be reduced.

2.2.3. Second Modification of First Sets of Processing

Figure 20:
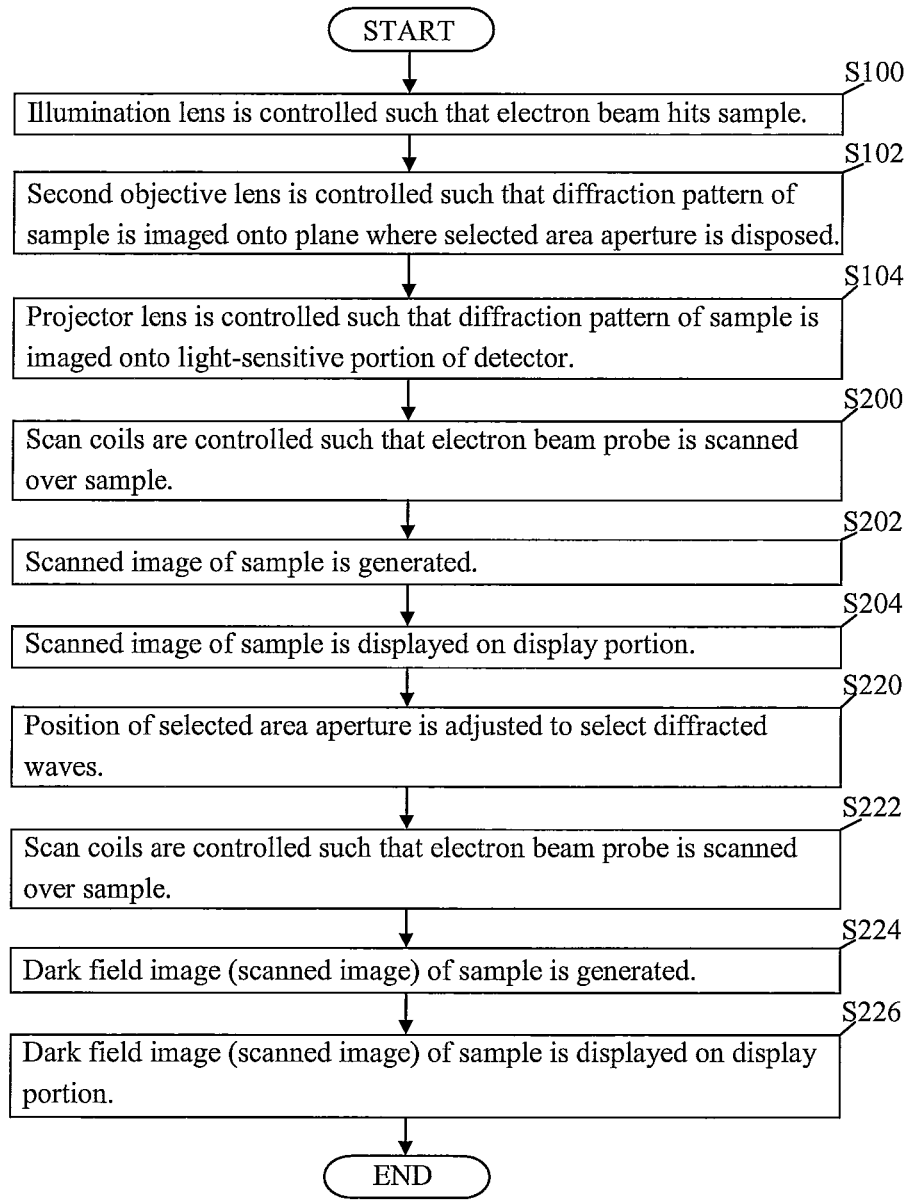
FIG. 20 is a flowchart illustrating one example of a second modification of the first sets of processing including steps performed by the processing portion of the transmission electron microscope associated with the second embodiment.
Figure 21:
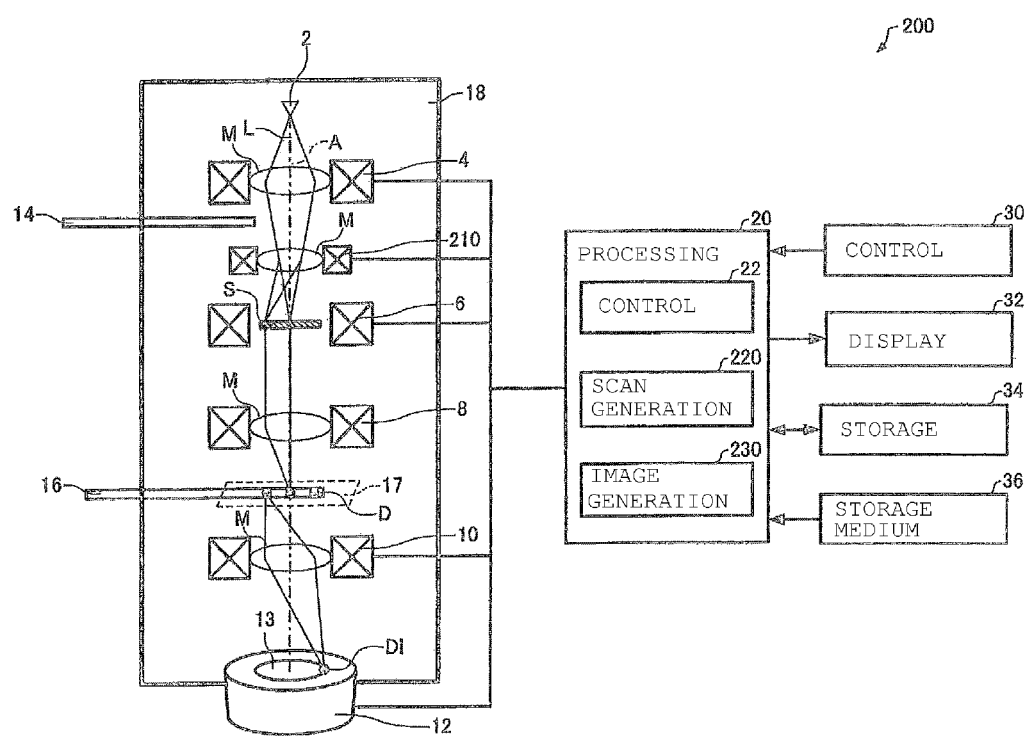
FIG. 21 is a vertical cross section similar to FIG. 19, but in which the processing portion performs the second modification of the first sets of processing.

A second modification of the first sets of processing is next described. FIG. 20 is a flowchart illustrating one example of the second modification of the first sets of processing including steps performed by the processing portion 20. FIG. 21 is a vertical cross section illustrating the operation of the transmission electron microscope 200 when the processing portion 20 performs the second modification of the first sets of processing. In FIG. 20, those steps which are identical in operation with the steps S100-S104 and S200-S204 illustrated in FIG. 16 are indicated by the same reference numerals as in FIG. 16. A detailed description of the operations, which are similar to their corresponding operations of the second embodiment already described in connection with FIG. 16, is omitted below.

In the first sets of processing associated with the second embodiment illustrated in FIG. 16, the processing portion 20 performs an operation for obtaining the diffraction pattern D of the sample S. In contrast, in the present modification, the processing portion 20 can perform an operation for obtaining a dark field image DI (scanned image).

First, the processing portion 20 executes the aforementioned steps S100, S102, S104, S200, S202, and S204 to display the scanned image of the sample S on the display portion 32.

The processing portion 20 then performs an operation to adjust the position of the selected area aperture 16 such that given diffracted waves of the diffraction pattern D are selected (step S220). The processing portion 20 performs an operation similar to step S130 illustrated in FIG. 10 to adjust the position of the selected area aperture 16 such that given diffracted waves are selected.

The scan signal generation portion 220 then performs an operation for generating a scan signal and controlling the scan coils 210 such that the electron beam probe arising from the electron beam L is scanned over the sample S (step S222).

The scanned image generation portion 230 then performs an operation for generating a dark field image DI (scanned image) of the sample S (step S224).

A detection signal, including information about the intensity of the electron beam, is delivered from the detector 12 and applied to the scanned image generation portion 230. Furthermore, the scan signal is entered to the scanned image generation portion 230 from the scan signal generation portion 220.

The scanned image generation portion 230 synchronizes the detection signal and scan signal and generates a scanned image of the sample S, the scanned image indicating a distribution of amounts of signal (intensities of the electron beam) at each sample position. In this example, the scanned image of the sample S corresponds to the dark field image DI of the sample S.

The scanned image generation portion 230 then performs an operation for displaying the generated dark field image DI (scanned image) of the sample S on the display portion 32 (step S226). The processing portion 20 ends the sequence of steps.

Because of execution of the second modification, the dark field image DI (scanned image) can be focused using the second objective lens 8 and projector lens 10. Accordingly, during observation of the dark field image DI (scanned image) of the sample S, the effects of the magnetic field on the sample S can be reduced.

2.2.4. Second Sets of Processing

Figure 22:
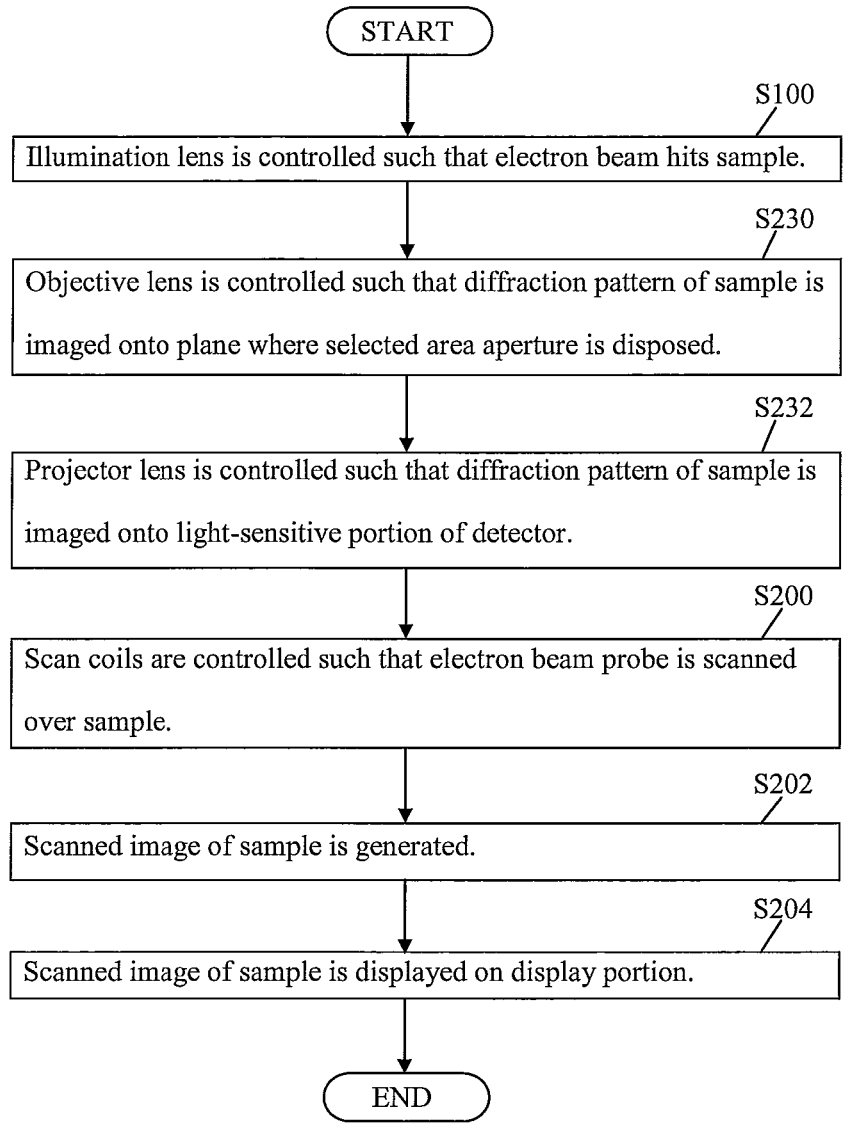
FIG. 22 is a flowchart illustrating one example of second sets of processing including steps performed by the processing portion of the transmission electron microscope associated with the second embodiment.
Figure 23:
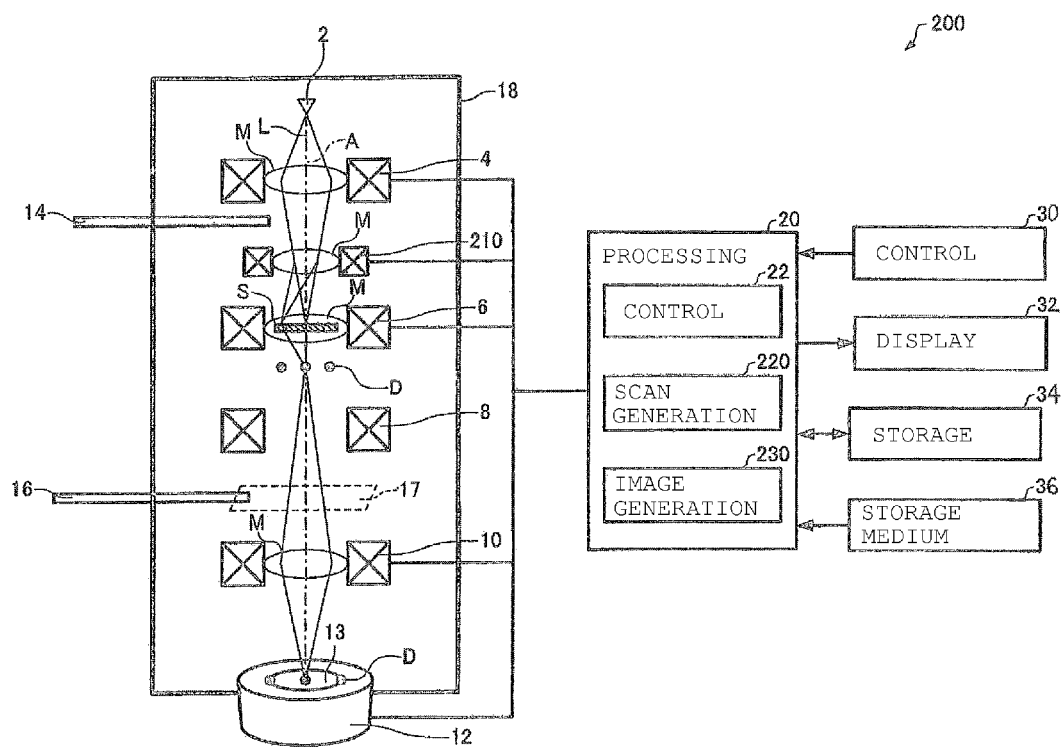
FIG. 23 is a vertical cross section similar to FIG. 21, but in which the processing portion performs the second sets of processing in a second mode of operation.

The second sets of processing are next described. FIG. 22 is a flowchart illustrating one example of the second sets of processing associated with the second embodiment including steps performed by the processing portion 20. FIG. 23 is a vertical cross section illustrating the operation of the transmission electron microscope 200 when the processing portion 20 performs the second sets of processing in the second mode. In FIG. 22, those steps which are similar in operation with the steps S100-S104 and S200-S204 illustrated in FIG. 16 are indicated by the same reference numerals as in FIG. 16. A detailed description of the operations similar to their counterparts of the first sets of processing already described in connection with FIG. 16 is omitted below.

First, the control portion 22 performs an operation for controlling the illumination lens 4 such that the electron beam L hits the sample S (step S100).

The control portion 22 then performs an operation for controlling the first objective lens 6 such that a diffraction pattern D of the sample S is generated (step S230). In particular, the control portion 22 supplies a given amount of excitation current to the coil 6a of the first objective lens 6 to excite it. Consequently, as shown in FIG. 23, the electron beam L can be focused onto the sample S. The first objective lens 6 permits the diffraction pattern D of the sample S to be imaged, the pattern emanating from the electron beam L transmitted through the sample S.

The control portion 22 then performs an operation for controlling the projector lens 10 such that the diffraction pattern D of the sample S imaged by the first objective lens 6 is focused onto the light-receiving portion 13 of the detector 12 (step S232).

The processing portion 20 then performs the steps S200, S202, and S204 described above. Consequently, the diffraction pattern D of the sample S is displayed on the display portion 32. The processing portion 20 ends the sequence of steps.

The control portion 22 performs an operation for controlling the projector lens 10 such that the operative conditions of the first objective lens 6 are held after the diffraction pattern D has been obtained and that the object plane of the projector lens 10 is a plane at which a real space image is focused. Thus, the real space image of this area can be obtained.

Because of the second sets of processing, a TEM image of the sample S such as diffraction pattern D or real space image can be formed using the first objective lens 6 and projector lens 10.

The transmission electron microscope 200 associated with the present embodiment has the following features.

Since the transmission electron microscope 200 associated with the present embodiment is configured including the scan coils 210, scan signal generation portion 220, and scanned image generation portion 230, a scanned image can be created.

Furthermore, the transmission electron microscope 200 associated with the present embodiment can focus a TEM image (scanned image) of the sample S by performing the first sets of processing by means of the control portion 22 of the processing portion 20 and using the second objective lens 8 and projector lens 10 as described previously. That is, a focused TEM image can be obtained without use of the first objective lens 6. Therefore, during observation of the TEM image, the effects of the magnetic field on the sample S can be reduced. As a consequence, a TEM image of a sample, for example, subject to the effects of a magnetic field can be observed without varying the internal state of the sample.

In addition, in the transmission electron microscope 200 associated with the present embodiment, the control portion 22 of the processing portion 20 can operate either in the first mode in which the first sets of processing are performed or in the second mode in which the second sets of processing are performed. Consequently, the processing portion 20 can operate in the first mode if the observed sample S is susceptible to the effects of a magnetic field and in the second mode if the observed sample S is unsusceptible to the effects of a magnetic field. Accordingly, the transmission electron microscope 100 can operate in a mode of operation selected according to the observed sample, e.g., whether the sample is subject to the effects of a magnetic field.

2.3. Modification of Transmission Electron Microscope

Figure 24:
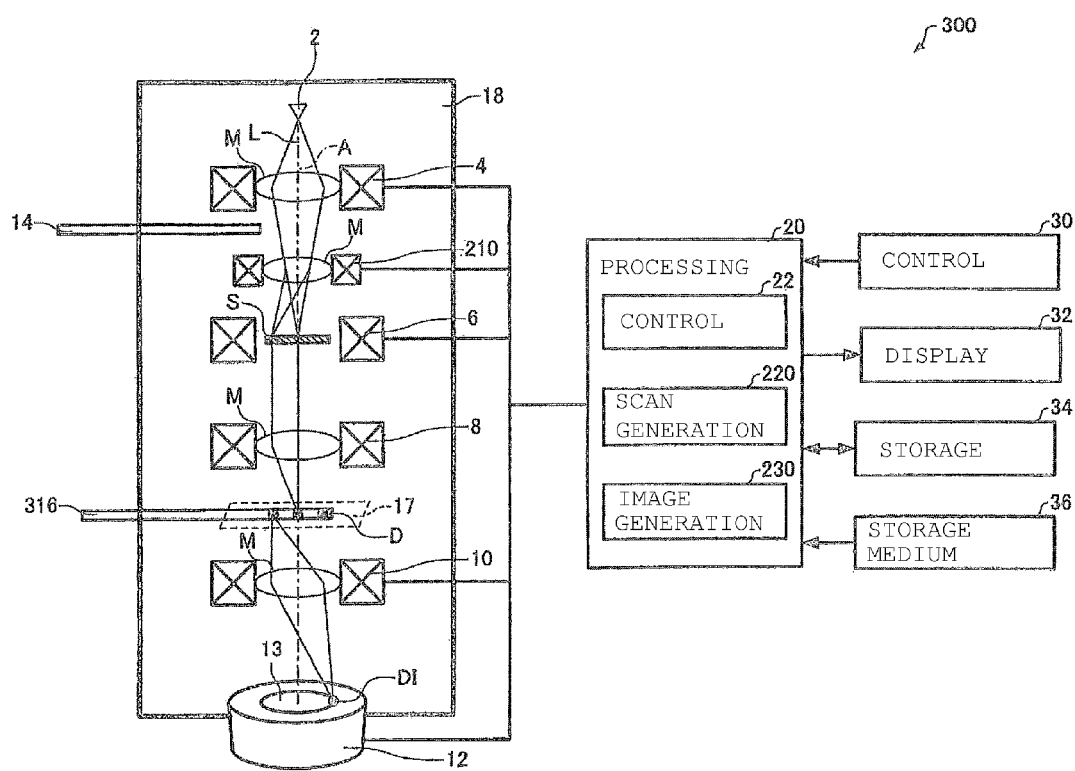
FIG. 24 is a vertical cross section similar to FIG. 15, but showing a modification of the second embodiment.
Figure 25:
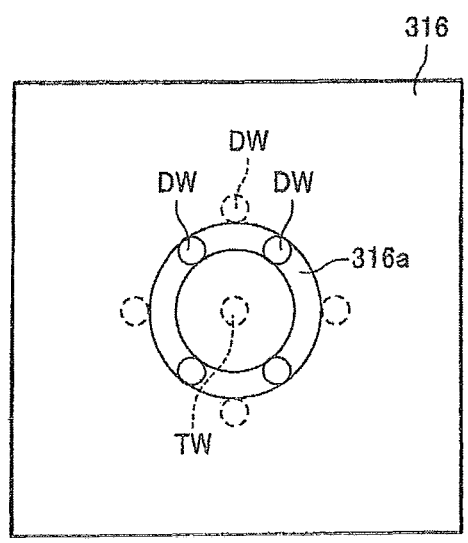
FIG. 25 is a schematic plan view of a selected area aperture for use in a transmission electron microscope.
Figure 26:
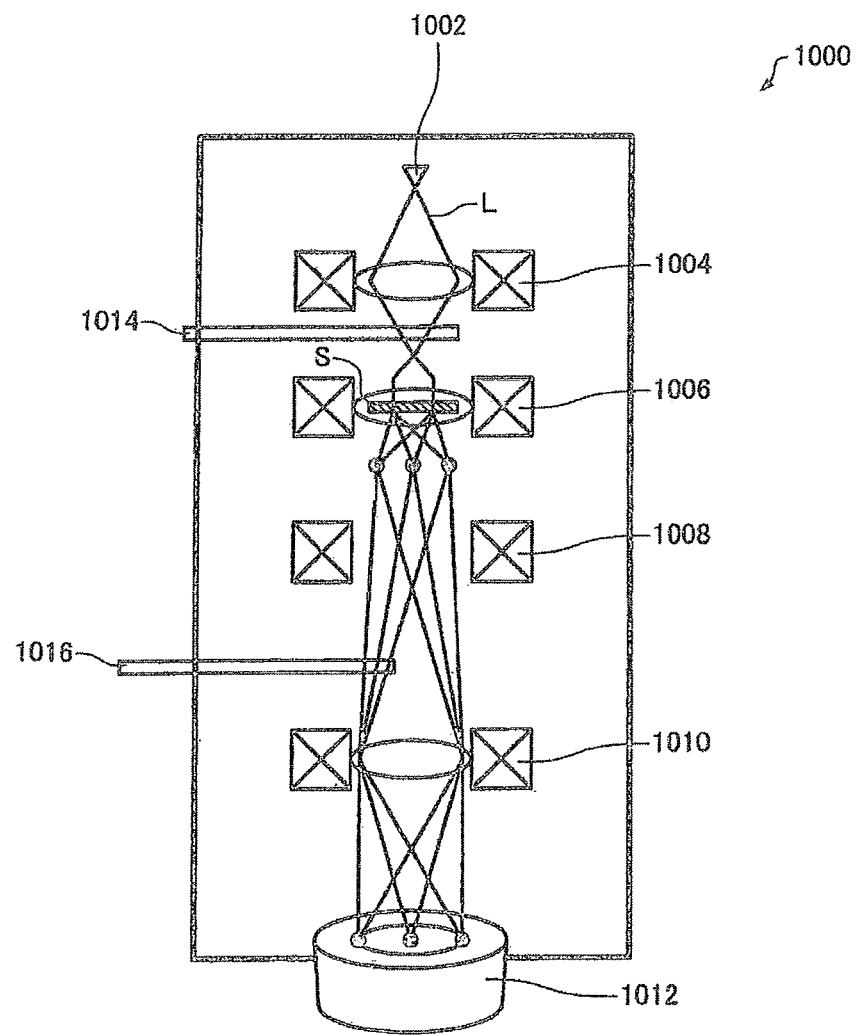
FIG. 26 is a vertical cross section of a conventional transmission electron microscope, illustrating one example of operation when a diffraction pattern of a sample is observed using selected-area electron beam diffraction.

A modification of the transmission electron microscope associated with the second embodiment is next described. FIG. 24 is a vertical cross section showing the configuration of a transmission electron microscope 300 associated with a modification of the second embodiment. FIG. 25 is a schematic plan view of a selected area aperture 316 for use in the microscope 300. FIG. 25 is a view of the selected area aperture 316, as viewed from the direction of the optical axis A. In the transmission electron microscope 300, those constituent members, which are similar in function with their counterparts of the above-described transmission electron microscope 200 are indicated by the same reference numerals as in the previously referenced figures and their detailed description, is omitted below.

As shown in FIGS. 24 and 25, the transmission electron microscope 300 has the selected area aperture 316 provided with an annular slit 316a.

The annular slit 316a in the selected area aperture 316 permits passage of only diffracted waves DW in a given angle relative to transmitted waves. That is, only the diffracted waves DW in the given angle can be selected by the use of the selected area aperture 316. Consequently, an annular dark field image (scanned image) can be created. Furthermore, electrons (diffracted waves), for example, scattered inelastically at high angles due to thermal diffuse scattering caused by lattice vibrations can be selected using the selected area aperture 316 and detected. This enables high-angle annular dark-field (HAADF) imaging.

Processing performed by the processing portion 20 of the transmission electron microscope 300 can be illustrated by a flowchart similar to the flowchart of FIG. 20 and so its illustration and description is omitted.

Since the selected area aperture 316 of the transmission electron microscope 300 has the annular slit 316a, annular dark field images and high-angle annular dark-field (HAADF) images can be created.

Similar annular dark field images and high-angle annular dark-field (HAADF) images may be obtained by not detecting transmitted waves by the use of an annular detector (not shown) without forming an annular slit in the selected area aperture.

For example, the various embodiments and modifications may be appropriately combined. In addition, as the need arises, these modifications can be applied to the above-described embodiments.

The present invention embraces configurations (such as configurations identical in function, method, and results or configurations identical in purpose and advantageous effects) substantially identical with the configurations described in the embodiments. Furthermore, the invention embraces configurations which are similar to the configurations described in the above embodiments except that nonessential parts thereof have been replaced. In addition, the invention embraces configurations identical in advantageous effects or purpose with the configurations described in the above embodiments. Further, the invention embraces configurations which are similar to the configurations of the above embodiments except that well-known techniques are added.

Having thus described my invention with the detail and particularity required by the Patent Laws, what is desired protected by Letters Patent is set forth in the following claims.

The invention claimed is:

1. A transmission electron microscope comprising:
an electron beam source emitting an electron beam;
an illumination lens for directing the electron beam emitted from the electron beam source at a sample;
a first objective lens having an upper polepiece and a lower polepiece, wherein said sample is placed between the upper polepiece and the lower polepiece;
a second objective lens disposed behind the first objective lens;
a selected area aperture disposed at a first plane and limiting passage of the electron beam transmitted through the sample;
a projector lens for bringing the TEM image of the sample formed by the first objective lens or the second objective lens into focus at a second plane;
a detector having a light-sensitive portion disposed at the second plane and detecting the TEM image of the sample; and
a control portion for controlling at least the illumination lens, the second objective lens, and the projector lens,
wherein said first plane is located between said second objective lens and said projector lens, and
wherein said control portion performs first sets of processing for controlling the illumination lens such that the electron beam hits the sample, controlling the second objective lens such that a diffraction pattern of the sample is imaged onto the first plane, and controlling the projector lens such that the TEM image of the sample focused by the second object lens is focused onto the second plane.

2. A transmission electron microscope as set forth in claim 1,
wherein said control portion can operate in a first mode where the first sets of processing are performed and in a second mode where second sets of processing are performed,
wherein said control portion controls said first objective lens, and
wherein said second sets of processing include a processing operation for controlling the illumination lens such that the electron beam hits the sample, a processing operation for controlling the first objective lens such that a TEM image of the sample is focused, and a processing operation for controlling the projector lens such that the TEM image of the sample formed by the first objective lens is focused onto the second plane.

3. A transmission electron microscope as set forth in any one of claims 1 and 2, wherein during execution of said first sets of processing, said control portion performs an operation for controlling said projector lens such that the TEM image of the sample focused onto the second plane is adjusted in sense.

4. A transmission electron microscope as set forth in any one of claims 1 to 2, further comprising:
- a scan signal generation portion for generating a scan signal;
- scan coils for scanning the electron beam coming from the illumination lens over the sample in response to the scan signal; and
- a scanned image generation portion for imaging a detection signal delivered from the detector in synchronism with the scan signal.

* * * * *